US008119468B2

(12) United States Patent
Miyairi et al.

(10) Patent No.: US 8,119,468 B2
(45) Date of Patent: Feb. 21, 2012

(54) THIN FILM TRANSISTOR AND METHOD FOR MANUFACTURING THE SAME

(75) Inventors: Hidekazu Miyairi, Kanagawa (JP); Koji Dairiki, Kanagawa (JP); Yuji Egi, Kanagawa (JP); Yasuhiro Jinbo, Kanagawa (JP); Toshiyuki Isa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 12/423,123

(22) Filed: Apr. 14, 2009

(65) Prior Publication Data

US 2009/0261328 A1    Oct. 22, 2009

(30) Foreign Application Priority Data

Apr. 18, 2008    (JP) ................ 2008-109657

(51) Int. Cl.
  *H01L 21/00*    (2006.01)
  *H01L 29/786*    (2006.01)
(52) U.S. Cl. .............. 438/158; 257/57; 257/E21.412
(58) Field of Classification Search ............... 438/151, 438/158; 257/57, E21.412
  See application file for complete search history.

(56) References Cited

U.S. PATENT DOCUMENTS

| | | | |
|---|---|---|---|
| 4,409,134 A | 10/1983 | Yamazaki |
| 5,101,242 A | 3/1992 | Ikeda et al. |
| 5,221,631 A | 6/1993 | Ikeda et al. |
| 5,311,040 A | 5/1994 | Hiramatsu et al. |
| 5,453,858 A | 9/1995 | Yamazaki |
| 5,514,879 A | 5/1996 | Yamazaki |
| 5,591,987 A | 1/1997 | Yamazaki et al. |
| 5,614,732 A | 3/1997 | Yamazaki |
| 5,648,662 A | 7/1997 | Zhang et al. |
| 5,677,236 A | 10/1997 | Saitoh et al. |
| 5,701,167 A | 12/1997 | Yamazaki |
| 5,766,989 A | 6/1998 | Maegawa et al. |
| 5,849,601 A | 12/1998 | Yamazaki |
| 5,859,445 A | 1/1999 | Yamazaki |

(Continued)

FOREIGN PATENT DOCUMENTS

EP    0 449 539 A2    10/1991

(Continued)

OTHER PUBLICATIONS

Arai et al., 41.2: Micro Silicon Technology for Active Matrix OLED Display, SID Digest '07 : SID International Symposium Digest of Technical Papers, vol. XXXVIII , pp. 1370-1373, 2007.

(Continued)

*Primary Examiner* — Khiem D Nguyen
*Assistant Examiner* — Christine Enad
(74) *Attorney, Agent, or Firm* — Nixon Peabody LLP; Jeffrey L. Costellia

(57) ABSTRACT

Disclosed is a thin film transistor which includes, over a substrate having an insulating surface, a gate insulating layer covering a gate electrode; a semiconductor layer which functions as a channel formation region; and a semiconductor layer including an impurity element imparting one conductivity type. The semiconductor layer exists in a state that a plurality of crystalline particles is dispersed in an amorphous silicon and that the crystalline particles have an inverted conical or inverted pyramidal shape. The crystalline particles grow approximately radially in a direction in which the semiconductor layer is deposited. Vertexes of the inverted conical or inverted pyramidal crystal particles are located apart from an interface between the gate insulating layer and the semiconductor layer.

27 Claims, 24 Drawing Sheets

U.S. PATENT DOCUMENTS

| | | | |
|---|---|---|---|
| 5,864,150 | A | 1/1999 | Lin |
| 5,932,302 | A | 8/1999 | Yamazaki et al. |
| 6,011,277 | A | 1/2000 | Yamazaki |
| 6,023,075 | A | 2/2000 | Yamazaki |
| 6,153,893 | A | 11/2000 | Inoue et al. |
| 6,171,674 | B1 | 1/2001 | Yamazaki et al. |
| 6,183,816 | B1 | 2/2001 | Yamazaki et al. |
| 6,252,249 | B1 | 6/2001 | Yamazaki |
| 6,281,520 | B1 | 8/2001 | Yamazaki |
| 6,306,213 | B1 | 10/2001 | Yamazaki |
| 6,410,372 | B2 * | 6/2002 | Flewitt ............ 438/158 |
| 6,468,617 | B1 | 10/2002 | Yamazaki et al. |
| 6,468,839 | B2 | 10/2002 | Inoue et al. |
| 6,483,124 | B2 | 11/2002 | Flewitt |
| 6,737,676 | B2 | 5/2004 | Yamazaki |
| 6,756,258 | B2 | 6/2004 | Zhang et al. |
| 6,835,523 | B1 | 12/2004 | Yamazaki et al. |
| 7,067,844 | B2 | 6/2006 | Yamazaki |
| 7,098,479 | B1 | 8/2006 | Yamazaki |
| 7,115,902 | B1 | 10/2006 | Yamazaki |
| 7,199,846 | B2 | 4/2007 | Lim |
| 2002/0009819 | A1 | 1/2002 | Flewitt |
| 2005/0022864 | A1 | 2/2005 | Fujioka et al. |
| 2005/0064667 | A1 * | 3/2005 | Matsushita et al. ............ 438/287 |
| 2005/0085003 | A1 * | 4/2005 | Kishimoto et al. ............. 438/97 |
| 2005/0214455 | A1 * | 9/2005 | Li et al. ................. 427/248.1 |
| 2005/0233595 | A1 * | 10/2005 | Choi et al. .................... 438/778 |
| 2006/0027804 | A1 * | 2/2006 | Yamazaki et al. .............. 257/59 |
| 2006/0063391 | A1 * | 3/2006 | You et al. ..................... 438/771 |
| 2006/0079100 | A1 * | 4/2006 | Joshi et al. ................... 438/791 |
| 2006/0170111 | A1 * | 8/2006 | Isa et al. ....................... 257/775 |
| 2007/0295399 | A1 * | 12/2007 | Carlson ........................ 136/261 |
| 2008/0308807 | A1 * | 12/2008 | Yamazaki et al. .............. 257/59 |
| 2010/0096631 | A1 | 4/2010 | Miyairi et al. |
| 2010/0099217 | A1 * | 4/2010 | Isa et al. ....................... 438/104 |

FOREIGN PATENT DOCUMENTS

| | | |
|---|---|---|
| EP | 0 535 979 A2 | 4/1993 |
| EP | 1 505 174 A1 | 2/2005 |
| JP | 57-071126 | 5/1982 |
| JP | 58-092217 | 6/1983 |
| JP | 62-062073 | 3/1987 |
| JP | 62-062073 | 12/1987 |
| JP | 01-144682 | 6/1989 |
| JP | 02-001174 A | 1/1990 |
| JP | 02-053941 | 2/1990 |
| JP | 02-053941 | 11/1990 |
| JP | 02-053941 B2 | 11/1990 |
| JP | 04-242724 | 8/1992 |
| JP | 05-102454 | 4/1993 |
| JP | 06-326312 | 11/1994 |
| JP | 2000-277439 | 10/2000 |
| JP | 2001-007024 | 1/2001 |
| JP | 2004-014958 | 1/2004 |
| JP | 2005-049832 | 2/2005 |
| JP | 2005-167051 | 6/2005 |
| JP | 2005-322845 | 11/2005 |
| WO | WO-02/07207 A1 | 1/2002 |

OTHER PUBLICATIONS

Kim et al, 42.1: A Novel Four-Mask-Count Process Architecture for TFT-LCDs, SID Digest '00 : SID International Symposium Digest of Technical Papers, pp. 1006-1009, 2000.

Song et al., 34.1: Advanced Four-Mask Process Architecture for the a-Si TFT Array Manufacturing Method, SID Digest '02 : SID International Symposium Digest of Technical Papers, pp. 1038-1041, 2002.

Choi et al., P-16: Novel Four-Mask Process in the FFS TFT-LCD With Optimum Multiple-Slit Design Applied by the Use of a Gray-Tone Mask, SID Digest '05 : SID International Symposium Digest of Technical Papers, pp. 284-287, 2005.

Fujiwara et al., Stress-Induced Nucleation of Microcrystalline Silicon From Amorphous Phase, Jpn. J. Appl. Phys., 41/Part1, 2821-2828, 2002.

Kamei et al., A Significant Reduction of Impurity Contents in Hydrogenated Microcrystalline Silicon Films for Increased Grain Size and Reduced Defect Density, Jpn. J. Appl. Phys., 37/Part2, L265-L268, 1998.

Lee et al., How to Achieve High Mobility Thin Film Transistors by Direct Deposition of Silicon Using 13.56 MHz RF PECVD?, Int. Electron Devices Meeting Tech. Digest, p. 295-298, 2006.

Czhang et al., Directly Deposited Nanocrystalline Silicon Thin-Film Transistors With Ultra High Mobilities, Appl. Phys. Lett., 89, pp. 252101-1-252101-3, 2006.

Fujiwara et al., Real-time spectroscopic ellipsometry studies of the nucleation and grain growth processes in microcrystalline silicon thin films, Phys. Rev. B, 63, pp. 115306-1-115306-9, 2001.

Fujiwara et al., Microcrystalline silicon nucleation sites in the subsurface of hydrogenated amorphous silicon, Sur. Sci,, 497, pp. 333-340, 2002.

Lee et al., How to Achieve High Mobility Thin Film Transistors by Direct Deposition of Silicon Using 13.56 MHz RF PECVD?, Int. Electron Devices Meeting Tech. Digest, Dec. 11, 2006, pp. 295-298.

Lee.C et al., "Stability of NC-SI:H TFTS With Silicon Nitride Gate Dielectric,"IEEE Transactions on Electron Devices, 2007, vol. 54, No. 1, pp. 45-51.

International Search Report (Application No. PCT/JP2009/057711; PCT11436) Dated Jun. 30, 2009.

Written Opinion (Application No. PCT/JP2009/057711; PCT11436) Dated Jun. 30, 2009.

International Search Report for PCT/JP2009/057816 Dated Jun. 23, 2009.

Written Opinion for PCT/JP2009/057816 Dated Jun. 23, 2009.

* cited by examiner

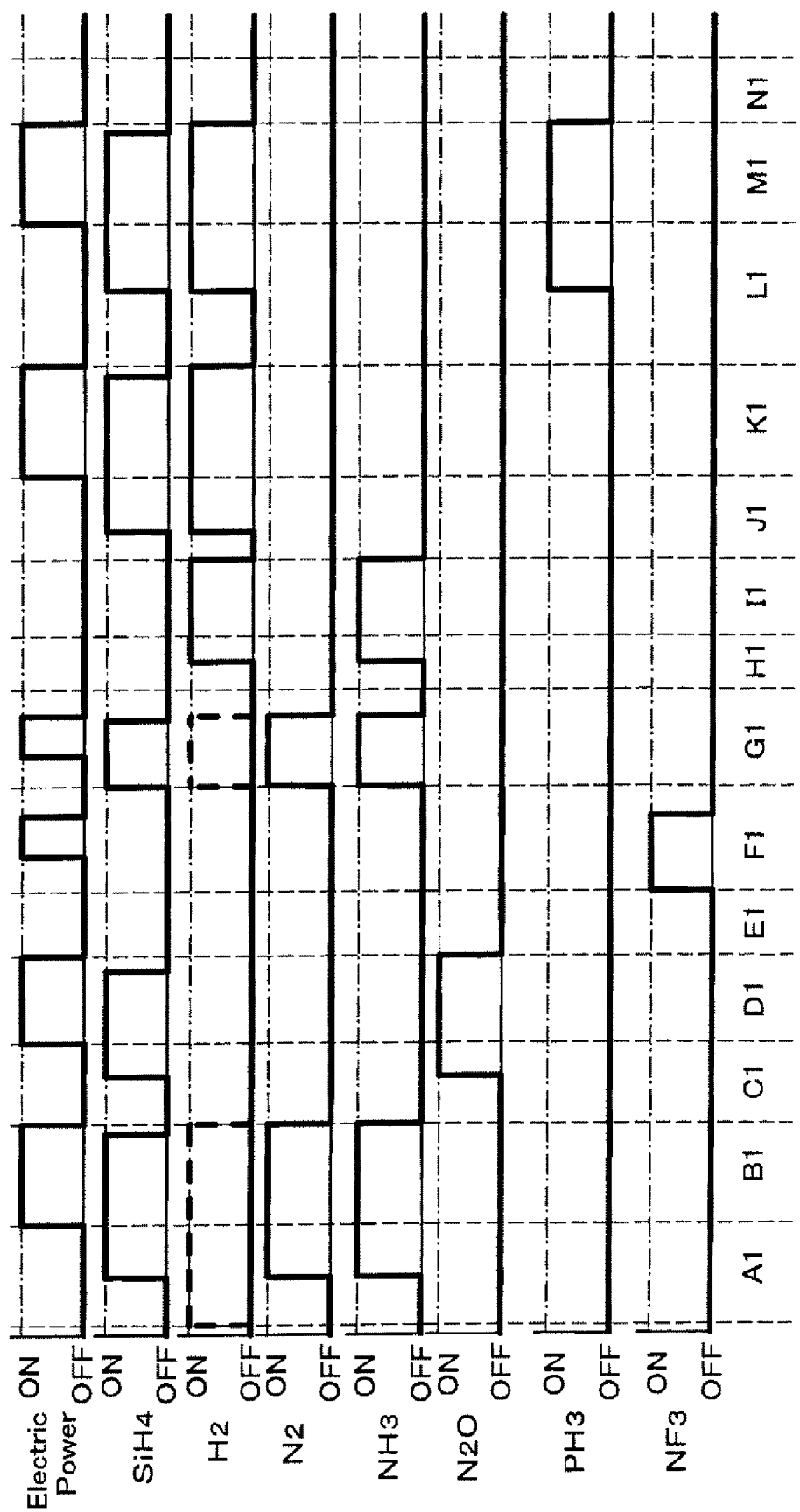

FIG. 8A
(A-1)
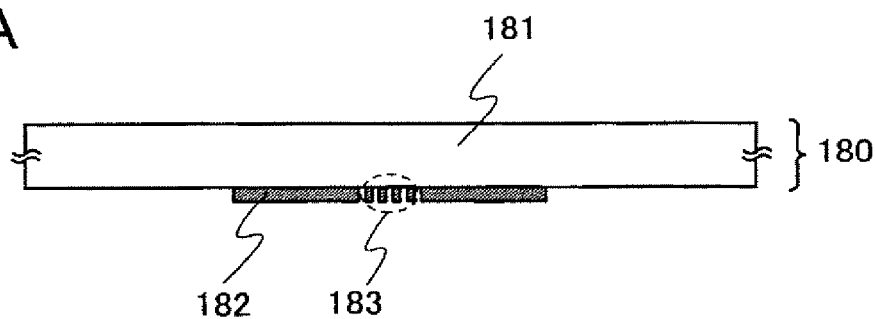
(A-2) Light transmittance
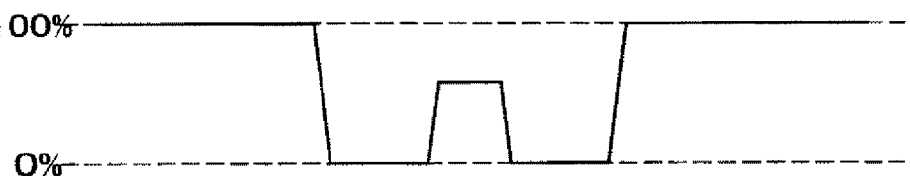
FIG. 8B
(B-1)
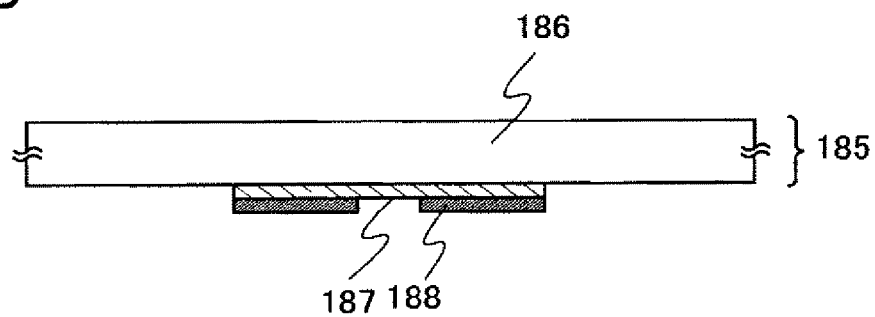
(B-2) Light transmittance
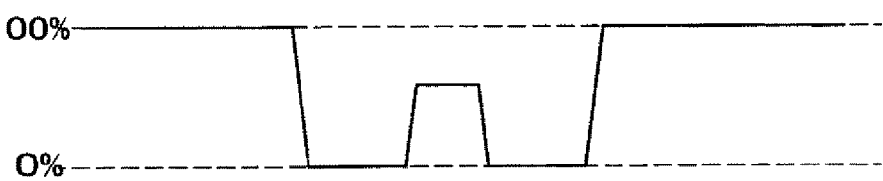

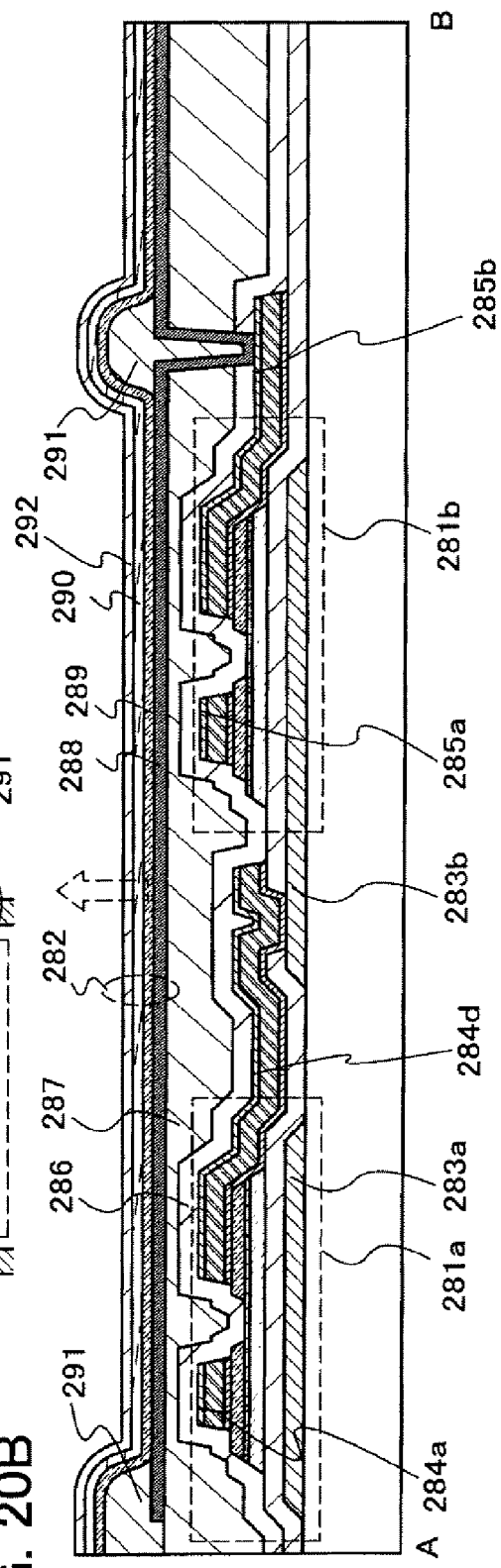

FIG. 22A
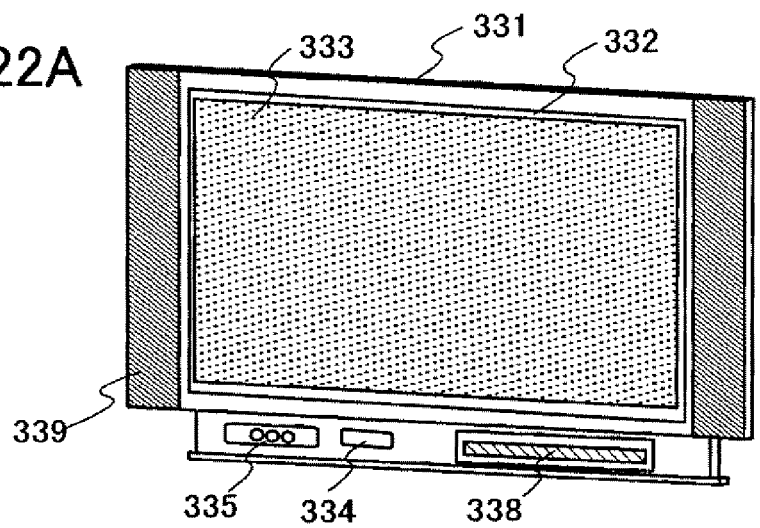
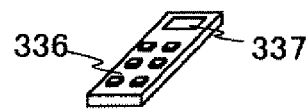
FIG. 22B
FIG. 22C
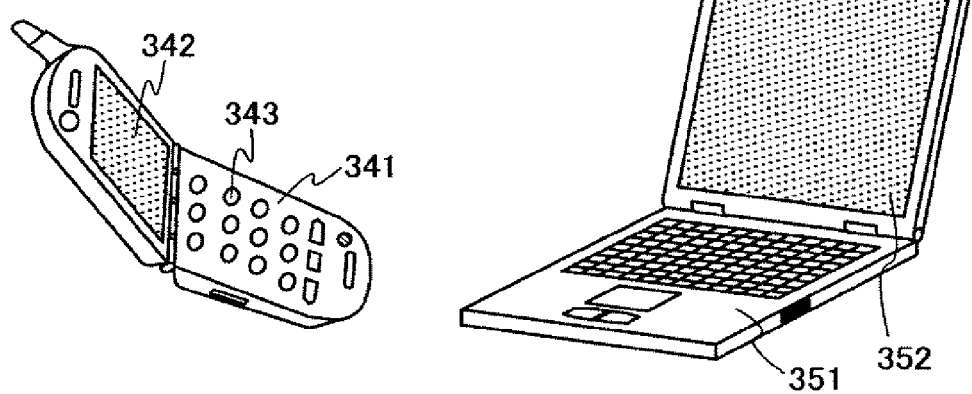
FIG. 22D
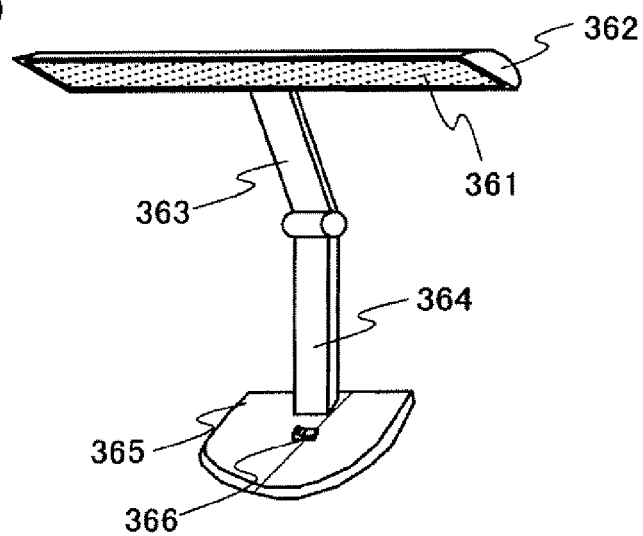

THIN FILM TRANSISTOR AND METHOD FOR MANUFACTURING THE SAME

TECHNICAL FIELD

The present invention relates to a thin film transistor and a method for manufacturing the same, and a semiconductor device and a display device using the thin film transistor.

BACKGROUND ART

Thin film transistors (hereinafter also referred to as "TFTs") are already widely used in a technical field of liquid crystal displays. A TFT is a kind of field-effect transistor, and is named due to the fact that a semiconductor film for forming a channel is formed with a small thickness. At present, a technique to manufacture a TFT using amorphous silicon or polycrystalline silicon as the thin semiconductor film has already been put into practical use.

A semiconductor material called "microcrystalline silicon" has been known for a long time together with amorphous silicon and polycrystalline silicon, and there also has been a report on microcrystalline silicon related to a field-effect transistor (for example, see Patent Document 1: U.S. Pat. No. 5,591,987). However, attention has not been paid on a TFT using microcrystalline silicon compared with an amorphous silicon transistor and a polycrystalline silicon transistor so far; thus, there has been a delay in practical use and reports thereof are made merely from an academic viewpoint (for example, see Non-Patent Document 1: Toshiaki Arai et al., "SID '07 DIGEST" 2007, pp. 1370-1373).

A microcrystalline silicon film can be formed over a substrate having an insulating surface, such as glass, by decomposing a source gas with plasma (weakly-ionized plasma) by a plasma CVD method; however, it has been considered to be difficult to control generation of crystal nuclei and crystal growth because reaction proceeds in a non-equilibrium state.

Various researches have been made on microcrystalline silicon. According to a hypothesis, growth mechanism of microcrystalline silicon is as follows: first, a portion of an amorphous phase, in which atoms are configured randomly, grows over a substrate, and then nuclei of crystals start to grow (see Non-Patent Document 2: Hiroyuki Fujiwara et al., "Japanese Journal of Applied Physics (Jpn. J. Appl. Phys.)" vol. 41, 2002, pp. 2821-2828). In Non-Patent Document 2, it is considered that the density of microcrystalline silicon nuclei can be controlled with the concentration of a hydrogen gas used in forming a microcrystalline silicon film because peculiar silicon-hydrogen bonds are observed on an amorphous surface when nuclei of microcrystalline silicon start to grow.

Further, influence on a growing surface of a microcrystalline silicon film due to an impurity element such as oxygen or nitrogen has also been investigated, and it has been reported that by reducing the concentration of the impurity element, the size of a crystal particle of a microcrystalline silicon film becomes large, and thus the defect density (especially, the defective charge density) is reduced (see Non-Patent Document 3: Toshihiro Kamei et al., "Japanese Journal of Applied Physics (Jpn. J. Appl. Phys.)" vol. 37, 1998, pp. L265-L268).

Further, there is a report that in order to improve operation characteristics of a TFT, the purity of a microcrystalline silicon film needs to be improved, and an attempt has been made to improve effective mobility by controlling the concentrations of oxygen, nitrogen, and carbon to be $5 \times 10^{16}$ cm$^{-3}$, $2 \times 10^{18}$ cm$^{-3}$, $1 \times 10^{18}$ cm$^{-3}$, respectively (see Non-Patent Document 4: C.-H. Lee, et al., "International Electron Devices Meeting Technical Digest (Int. Electron Devices Meeting Tech. Digest), 2006, pp 295-298). In addition, fabrication of a microcrystalline semiconductor film with improved effective mobility was reported, in which a deposition temperature in a plasma CVD was set to be 150° C. and the concentration of oxygen was reduced to be $1 \times 10^{16}$ cm$^{-3}$ (see Non-Patent Document 5: Czang-Ho Lee et al., "Applied Physics Letters (Appl. Phys. Lett.), Vol. 89, 2006, p 252101).

DISCLOSURE OF INVENTION

However, in a method of forming a microcrystalline silicon film in such a manner that after formation of an amorphous silicon film, a photothermal conversion layer formed using a metal material is provided and laser irradiation is performed, crystallinity can be improved; however, in terms of productivity, there is no advantage over a polycrystalline silicon film formed by laser annealing.

Although the peculiar silicon-hydrogen bonding is observed on an amorphous surface when nuclei of microcrystalline silicon start to grow, position and density of the nuclei generation cannot be controlled directly.

Further, the improvement of purity of a microcrystalline silicon and the reduction of the impurity concentration are capable of resulting in microcrystalline silicon film with large crystal particle size and reduced defect density (especially, the defective charge density). However, although such an effort contributes to the change in physical property of the microcrystalline silicon film, and element characteristics of a TFT or the like are not always improved by these strategy. This is because, considering the fact that a semiconductor element is operated by intentionally controlling flow of carriers of electrons or holes which flow through a semiconductor, improvement of the element characteristics requires the improvement of the film quality of a specific part of the microcrystalline silicon film which contributes to flow of the carriers.

In view of the foregoing, it is an object of one embodiment of the present invention to control a quality of a microcrystalline semiconductor film or a semiconductor film including crystal particles so that operation characteristics of a semiconductor element typified by a TFT can be improved. It is another object of one embodiment of the present invention to improve characteristics of a semiconductor element typified by a TFT by controlling a deposition process of a microcrystalline semiconductor film or a semiconductor film including crystal particles. In addition, it is another object of one embodiment of the present invention to increase on-state current of a thin film transistor.

One embodiment of the present invention is that in a formation of semiconductor layer including a plurality of crystalline regions in an amorphous structure, generation positions and generation density of crystal nuclei from which the crystalline regions start to grow are controlled, whereby the quality of the semiconductor layer is controlled. Another embodiment of the present invention is that in fabrication of a thin film transistor in which a semiconductor layer including a plurality of crystalline regions in an amorphous structure is used as a channel formation region, generation positions and generation density of crystal nuclei from which the crystalline regions start to grow are controlled in accordance with a region where carries flow.

A semiconductor layer including a plurality of crystalline regions in an amorphous structure is formed using, as a reactive gas, a gas in which a semiconductor source gas (e.g. a silicon hydride gas, a silicon fluoride gas, or a silicon chloride gas) and a diluent gas are mixed at a mixture rate at which a microcrystalline semiconductor can be generated. The reactive gas is introduced into an ultrahigh vacuum reaction chamber where a concentration of oxygen is reduced, and a predetermined pressure is maintained to generate glow discharge plasma. Accordingly, a film is deposited over a substrate which is placed in the reaction chamber. At the early stage of deposition, an impurity element which disturbs generation of crystal nuclei is allowed to be included in the reaction chamber and the concentration of the impurity element is reduced gradually, whereby crystal nuclei are generated and crystalline regions are formed based on the crystal nuclei.

It is preferable to use nitrogen or a nitride as an impurity which disturbs generation of crystal nuclei. In the case of making nitrogen included in the semiconductor layer, the concentration of nitrogen in the semiconductor layer, which is measured by SIMS, is $1\times10^{20}$ cm$^{-3}$ to $1\times10^{21}$ cm$^{-3}$. The peak concentration of nitrogen in the vicinity of the interface between a gate insulating layer and the semiconductor layer, which is measured by SIMS, is $3\times10^{20}$ cm$^{-3}$ to $1\times10^{21}$ cm$^{-3}$ and the concentration of nitrogen is reduced in a thickness direction of the semiconductor layer from the vicinity of the aforementioned interface, whereby nuclei generation positions, from which the crystalline regions start to grow, and nuclei generation density are controlled.

Note that as for the impurity element which suppresses generation of crystal nuclei, an impurity element which does not trap carriers when it is included in silicon is selected. On the other hand, the concentration of an impurity element (e.g. oxygen) which generates dangling bonds of silicon is reduced. That is, it is preferable that the concentration of oxygen, which is measured by SIMS, be less than or equal to $5\times10^{18}$ cm$^{-3}$.

A thin film transistor which is one embodiment of the present invention has a semiconductor layer including a plurality of crystalline regions in an amorphous structure. A pair of semiconductor layers including an impurity element imparting one conductivity type, which form a source region and a drain region, is provided over the semiconductor layer.

Note that in this specification, the concentration is measured by secondary ion mass spectrometry (hereinafter referred to as SIMS). However, there is no limitation particularly when descriptions of other measurement methods are made.

Note that in this specification, on-state current is current which flows between source and drain electrodes when a transistor is on.

Further, off-state current is current which flows between source and drain electrodes when a transistor is off. For example, in the case of an n-type transistor, the off-state current is current which flows between source and drain electrodes when a gate voltage of the transistor is lower than a threshold voltage thereof.

In a semiconductor layer including a plurality of crystalline regions in an amorphous structure, the present invention allows the generation density and generation positions of the crystalline regions to be controlled. By using such a semiconductor layer as a channel formation region of a thin film transistor, on-state current can be increased.

BRIEF DESCRIPTION OF DRAWINGS

In the accompanying drawings:
FIG. 7 is a view showing an example of a method for manufacturing a thin film transistor;
FIGS. 8A and 8B are views illustrating an example of a method for manufacturing a thin film transistor;
FIG. 20A is a plan view illustrating an electronic device,
and FIG. 20B is a cross-sectional view thereof;
FIGS. 22A to 22D are views each illustrating an electronic device.

BEST MODE FOR CARRYING OUT THE INVENTION

Figure 1:
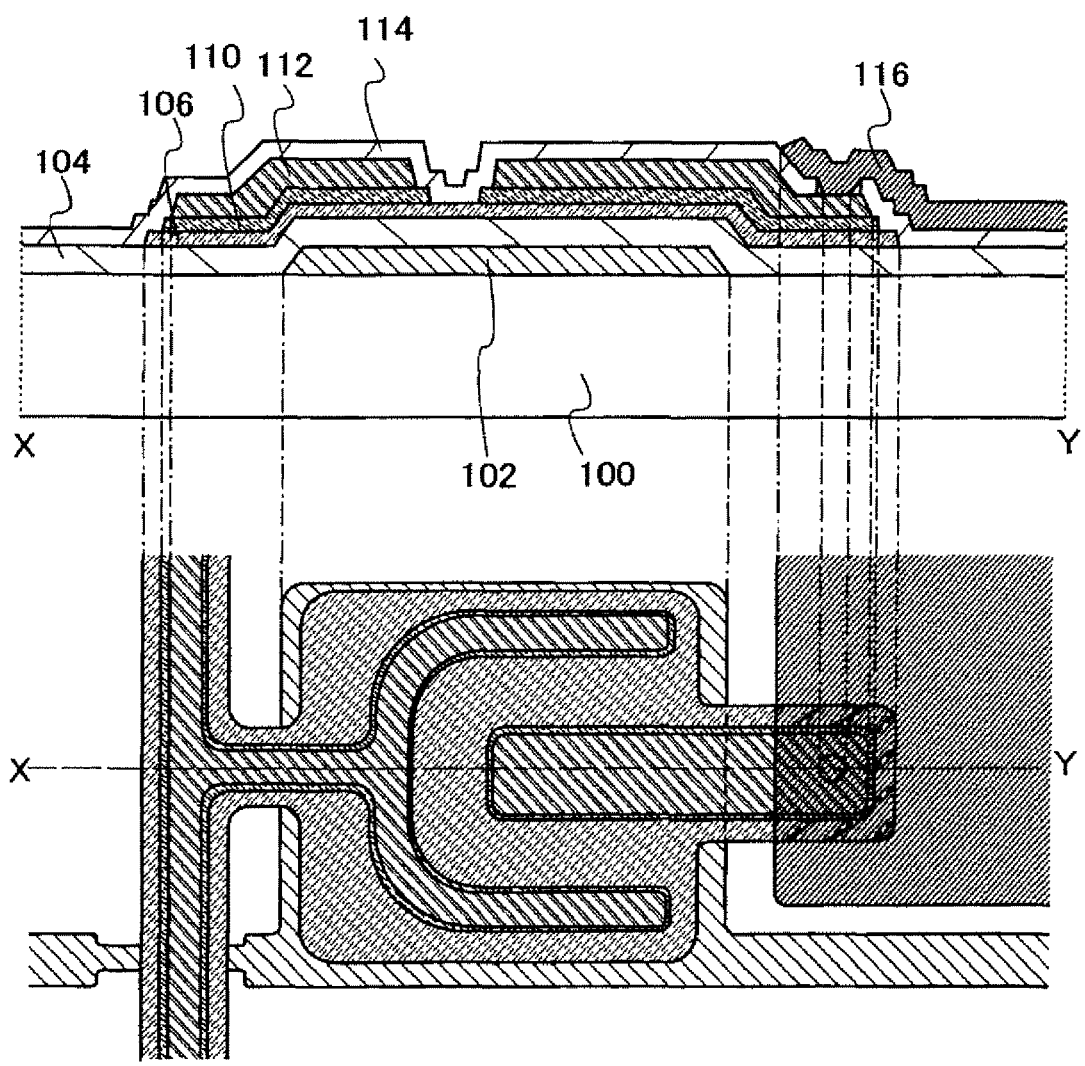
FIG. 1 is a view illustrating an example of a thin film transistor.

Hereinafter, embodiments of the present invention will be described in detail with reference to the drawings. Note that it is easily understood by those skilled in the art that the present invention is not limited to the description below and that a variety of changes can be made in forms and details without departing from the spirit and the scope of the present invention. Accordingly, the present invention should not be construed as being limited to the description of the embodiments below. Note that in the description made with reference to the drawings, the same reference numerals denoting like portions are used in common in different drawings. The same hatching pattern is applied to similar portions, and the similar portions are not especially denoted by reference numerals in some cases.

DETAILED DESCRIPTION OF THE INVENTION

Embodiment 1

In this embodiment, an example of a mode of a thin film transistor will be described with reference to the drawings.

FIG. 1 is a top view and a cross-sectional view of a thin film transistor according to this embodiment. The thin film transistor illustrated in FIG. 1 includes a gate electrode layer 102 over a substrate 100; a gate insulating layer 104 covering the gate electrode layer 102; a semiconductor layer 106 provided over and in contact with the gate insulating layer; and source and drain regions 110 provided over and in contact with the semiconductor layer 106. Further, the thin film transistor includes wiring layers 112 provided over and in contact with the source and drain regions 110. The wiring layers 112 form source and drain electrodes. The thin film transistor includes, over the wiring layers 112, an insulating layer 114 serving as a protective film. Each layer is patterned into a desired shape.

Note that the thin film transistor illustrated in FIG. 1 can be applied to a pixel transistor provided in a pixel portion of a liquid crystal display device. Therefore, in an example illustrated in FIG. 1, an opening is provided in the insulating layer 114, a pixel electrode layer 116 is provided over the insulating layer 114, so that the pixel electrode layer 116 and one of the wiring layers 112 are connected to each other.

Further, one of the source and drain electrodes is formed so as to have a U shape (a reversed C shape or a horseshoe shape), and surrounds the other of the source and drain electrodes. The distance between the source and drain electrodes is kept almost constant (see FIG. 1).

The source and drain electrodes of the thin film transistor have the above-described shape, whereby a channel width of the thin film transistor can be increased, and thus the amount of current is increased. In addition, variation in electric characteristics can be reduced. Further, decrease in reliability due to misalignment of a mask pattern in a manufacturing process can be suppressed. However, without limitation thereto, one of the source and drain electrodes does not necessarily have a U shape.

Here, the semiconductor layer 106 which is one of main features of the thin film transistor illustrated in FIG. 1 is described. The semiconductor layer 106 serves as a channel formation region of the thin film transistor. In the semiconductor layer 106, crystal particles including a crystalline semiconductor exist in the semiconductor layer having an amorphous structure in a dispersed manner (see FIG. 2).

The semiconductor layer 106 includes a first region 120 and a second region 122. The first region 120 has an amorphous structure. The second region 122 has a plurality of crystal particles 121 existing in a dispersed manner and an amorphous structure between the plurality of crystal particles 121. The first region 120 is provided over and in contact with the gate insulating layer 104 and has a thickness t1 from an interface between the first region 120 and the gate insulating layer 104. The second region 122 is provided over and in contact with the first region 120 and has a thickness t2. That is, nuclei generation positions of the crystal particles 121 are controlled in a thickness direction of the semiconductor layer 106 so that the nuclei generation positions can be present at a position of t1 from the interface between the first region 120 and the gate insulating layer 104. The nuclei generation positions of the crystal particles 121 are controlled by a concentration of an impurity element (e.g. a concentration of nitrogen) contained in the semiconductor layer 106, which suppresses crystallization.

Figure 2:
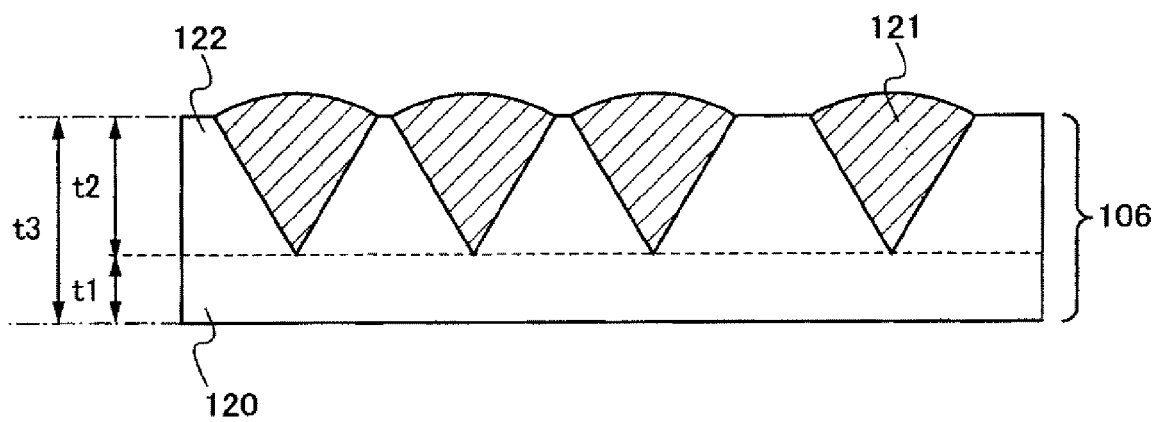
FIG. 2 is a view illustrating a semiconductor layer included in a thin film transistor.

The crystal particle 121 has an inverted conical or inverted pyramidal shape. The "inverted conical or inverted pyramidal shape" means a three-dimensional shape and is constructed by (i) a base which is constructed by a plurality of planes and (ii) lines linking the periphery of the base and a vertex which is located outside the base, wherein the vertex exists on a substrate side. In other words, an "inverted conical or inverted pyramidal shape" is a shape of the crystal particle 121 which grows approximately radially in a direction in which the semiconductor layer 106 is deposited, from a position away from the interface between the gate insulating layer 104 and the semiconductor layer 106. Each of crystal nuclei formed in a dispersed manner grows along crystal orientation during the formation of the semiconductor layer, whereby the crystal particles start to grow from the crystal nuclei so as to spread in an in-plane direction of a plane perpendicular to a direction of crystal growth. The semiconductor layer has such crystal particles, whereby on-state current can be increased compared with that of an amorphous semiconductor. Further, the crystal particle 121 includes a single crystal or a twin crystal. Here, crystal plane directions of a side surface of the crystal particle 121 having an inverted conical or inverted pyramidal shape are aligned and the side surface (the line that connects the periphery with the vertex) is straight (FIG. 2). Therefore, it can be considered that the crystal particle 121 is close to a single crystal or a form including twin crystals rather than a form including a plurality of crystals. In the case of the form including twin crystals, the number of dangling bonds is small; therefore, the number of defects and the amount of off-state current are small as compared to the case of the form including a plurality of crystals. Further, the number of grain boundaries is small and the amount of on-state current is large in the case of the form including twin crystals as compared to the case of the form including a plurality of crystals. Note that the crystal particle 121 may include a plurality of crystals.

Note that the term "twin crystals" means that two different crystal grains are bonded to each other with highly favorable consistency at a crystal boundary. In other words, the "twin crystals" has a structure in which a trap level due to crystal defects or the like is hardly formed with crystal lattices continuously arranged at a crystal boundary. Thus, it can be considered that a crystal boundary does not substantially exist in a region having such a crystal structure.

Note that as an impurity element which suppresses generation of crystal nuclei, an impurity element (e.g. nitrogen), which does not trap carriers when it is included in silicon, is selected. On the other hand, a concentration of an impurity element (e.g. oxygen) which generates dangling bonds of silicon is reduced. Accordingly, the concentration of oxygen is preferably reduced without reducing the concentration of nitrogen. Specifically, it is preferable that the concentration of oxygen measured by SIMS be less than or equal to $5 \times 10^{18}$ cm$^{-3}$.

Further, the semiconductor layer 106 is formed under conditions that nitrogen exists on the surface of the gate insulating layer 104. Here, the concentration of nitrogen is important because it determines nuclei generation positions. When the semiconductor layer 106 is formed over the gate insulating layer 104 on which nitrogen exists, first, the first region 120 is formed, and after that, the second region 122 is formed. Here, the position of the interface between the first region 120 and the second region 122 is determined by the concentration of nitrogen. When the concentration of nitrogen measured by SIMS is greater than or equal to $1 \times 10^{20}$ cm$^{-3}$ and less than or equal to $1 \times 10^{21}$ cm$^{-3}$, preferably greater than or equal to $2 \times 10^{20}$ cm$^{-3}$ and less than or equal to $7 \times 10^{20}$ cm$^{-3}$, crystal nuclei are generated, and thus the second region 122 is formed. That is, in generation positions of the crystal nuclei from which the crystal particles 121 start to grow, the concentration of nitrogen measured by SIMS is greater than or equal to $1 \times 10^{20}$ cm$^{-3}$ and less than or equal to $1 \times 10^{21}$ cm$^{-3}$, preferably greater than or equal to $2 \times 10^{20}$ cm$^{-3}$ and less than or equal to $7 \times 10^{20}$ cm$^{-3}$. In other words, at apexes of the crystal particles 121 having inverted conical or inverted pyramidal shapes, the concentrations of nitrogen measured by SIMS are greater than or equal to $1 \times 10^{20}$ cm$^{-3}$ and less than or equal to $1\times10^{21}$ cm$^{-3}$, preferably greater than or equal to $2\times10^{20}$ cm$^{-3}$ and less than or equal to $7\times10^{20}$ cm$^{-3}$.

Further, the concentration of nitrogen is reduced gradually as a distance from the interface between the gate insulating layer 104 and the semiconductor layer 106 becomes longer. From the interface between the gate insulating layer 104 and the semiconductor layer 106, the concentration of nitrogen is preferably reduced by one digit, from the interface between the gate insulating layer 104 and the semiconductor layer 106, in the range of greater than or equal to 25 nm and less than or equal to 40 nm, more preferably in the range of greater than or equal to 30 nm and less than or equal to 35 nm.

As described above, the crystal particles exist in a dispersed manner. In order that the crystal particles exist in a dispersed manner, generation density of crystal nuclei needs to be controlled. The concentration of nitrogen is set to be in the above range, whereby generation density of the crystal nuclei can be controlled and the crystal particles can exist in a dispersed manner.

Note that when an impurity element which suppress generation of the crystal nuclei exists at a high concentration (the concentration of the impurity element measured by SIMS is about greater than or equal to $1\times10^{20}$ cm$^{-3}$) crystal growth is also suppressed; therefore, nitrogen which is to be contained in the semiconductor layer 106 is added to only a surface on which the semiconductor layer 106 is formed, and alternatively, nitrogen is introduced only at the early stage of formation of the semiconductor layer 106.

Next, a method for manufacturing the thin film transistor illustrated in FIG. 1 is described. An n-channel thin film transistor has higher carrier mobility than a p-channel thin film transistor. It is preferable that all thin film transistors formed over one substrate have the same polarity because the number of manufacturing steps can be reduced. Therefore, in this embodiment, a method for manufacturing an n-channel thin film transistor will be described.

Figure 3A:
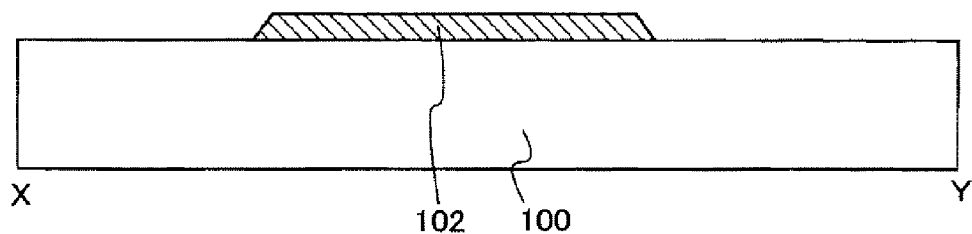
FIGS. 3A to 3C are views illustrating an example of a method for manufacturing a thin film transistor.

First, the gate electrode layer 102 is formed over the substrate 100 (see FIG. 3A).

As the substrate 100, in addition to a glass substrate and a ceramic substrate, a plastic substrate or the like with heat resistance which can withstand a process temperature in this manufacturing process can be used. In the case where a substrate does not need a light-transmitting property, a substrate in which an insulating layer is provided on a surface of a substrate of a metal such as a stainless steel alloy may be used. As a glass substrate, an alkali-free glass substrate formed using barium borosilicate glass, aluminoborosilicate glass, aluminosilicate glass, or the like may be used. In the case of where the substrate 100 is a mother glass, the substrate may have any of the following sizes: the first generation (e.g. 320 mm×400 mm) not only to the seventh generation (e.g. 1870 mm×2200 mm) or the eighth generation (e.g. 2200 mm×2400 mm), but also to the ninth generation (e.g. 2400 mm×2800 mm) or the tenth generation (e.g. 2950 mm×3400 mm).

The gate electrode layer 102 can be formed in a single layer or a stacked layer using a metal such as molybdenum, titanium, chromium, tantalum, tungsten, aluminum, copper, neodymium, or scandium, or an alloy which includes any of these materials as a main component. In the case of using aluminum, when an Al—Ta alloy in which aluminum is alloyed with tantalum is used, hillocks are suppressed, which is preferable. Further, when an Al—Nd alloy in which aluminum is alloyed with neodymium is used, increase in electric resistance can be suppressed and generation of hillocks can be suppressed, which is more preferable. Alternatively, an AgPdCu alloy or a semiconductor typified by polycrystalline silicon doped with an impurity element such as phosphorus may be used. For example, a two-layer structure in which a molybdenum layer is stacked over an aluminum layer, a two-layer structure in which a molybdenum layer is stacked over a copper layer, or a two-layer structure in which a titanium nitride layer or a tantalum nitride is stacked over a copper layer is preferable. When a metal layer functioning as a barrier layer is stacked over a layer with low electric resistance, electric resistance can be reduced and diffusion of a metal element from the metal layer into the semiconductor layer can be prevented. Alternatively, a two-layer structure including a titanium nitride layer and a molybdenum layer or a three-layer structure in which a tungsten layer having a thickness of 50 nm, an alloy layer of aluminum and silicon having a thickness of 500 nm, and a titanium nitride layer having a thickness of 30 nm are stacked may be used. In the case where a three-layer structure is employed, a tungsten nitride layer may be used instead of the tungsten layer of the first conductive layer; an aluminum-titanium alloy layer may be used instead of the aluminum-silicon alloy layer of the second conductive layer; or a titanium layer may be used instead of the titanium nitride layer of the third conductive layer. For example, when a molybdenum layer is stacked over an Al—Nd alloy layer, a conductive layer which has excellent heat resistance and electrically low resistance can be formed.

The gate electrode layer 102 can be formed in such a manner that a conductive layer is formed over the substrate 100, using the above material by a sputtering method, a vacuum evaporation method, or the like, a resist mask is formed over the conductive layer by a photolithography method, an inkjet method, or the like, and the conductive layer is etched using the resist mask. Alternatively, the gate electrode layer 102 can be formed by discharging a conductive nanopaste of silver, gold, copper, or the like over the substrate by an inkjet method and baking the conductive nanopaste. Note that a nitride layer of any of the above metals may be provided between the substrate 100 and the gate electrode layer 102. Here, the conductive layer is formed over the substrate 100, and etching is performed using a resist mask which is formed using a photomask.

Note that it is preferable that side surfaces of the gate electrode layer 102 be tapered. This is in order to prevent defective formation at a stepped portion because the semiconductor layer, the wiring layer, and the like are to be formed over the gate electrode layer 102 in a later step. In order that the side surfaces of the gate electrode layer 102 are tapered, etching may be performed while the resist mask is made to recede. For example, by making an oxygen gas contained in an etching gas (e.g. a chlorine gas), etching can be performed while the resist mask is thinned.

Through the step of forming the gate electrode layer 102, a gate wiring (a scanning line) can also be formed at the same time. Further, a capacitor line included in a pixel portion can also be formed at the same time. Note that a "scanning line" means a wiring which is provided for selecting a pixel, while a "capacitor line" means a wiring which is connected to one electrode of a storage capacitor in a pixel. However, without limitation thereto, the gate electrode layer 102 and either or both a gate wiring and a capacitor wiring may be formed separately.

Figure 3B:
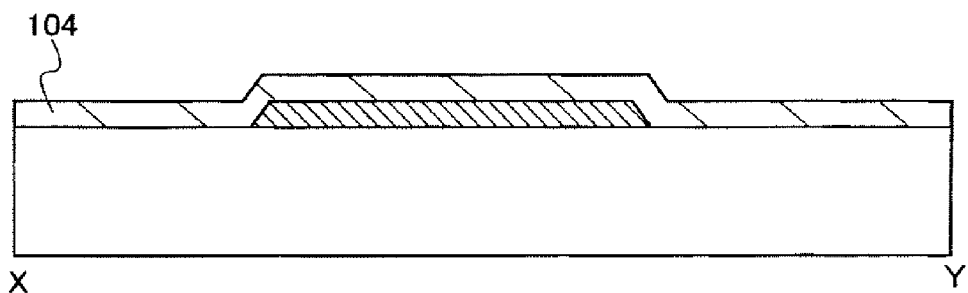
Figure 3C:
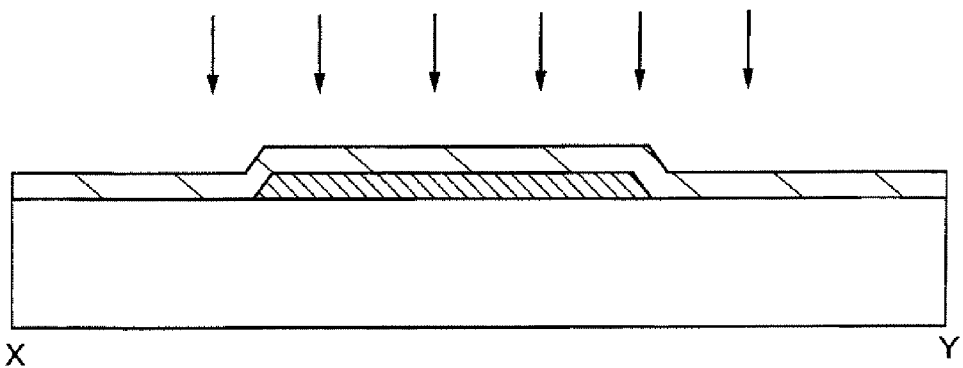

Next, the gate insulating layer 104 is formed so as to cover the gate electrode layer 102 (see FIG. 3B). The gate insulating layer 104 can be formed in a single layer or a stacked layer, using silicon oxide, silicon nitride, silicon oxynitride, or silicon nitride oxide by a CVD method, a sputtering method, or the like. Further, it is preferable that the gate insulating layer 104 be formed using a microwave plasma CVD apparatus with a high frequency (about 1 GHz). When the gate insulating layer 104 is formed by a microwave plasma CVD apparatus with a high frequency, the withstand voltage between a gate electrode and a drain electrode or a source electrode can be improved; therefore, a highly reliable thin film transistor can be obtained. Further, the gate insulating layer 104 is formed using silicon oxynitride, so that fluctuation in a threshold voltage of a transistor can be suppressed.

Silicon oxynitride defined in the specification contains higher composition of oxygen than that of nitrogen, and measurements using Rutherford backscattering spectrometry (RBS) and hydrogen forward scattering (HFS) show composition of oxygen, nitrogen, silicon, and hydrogen ranging from 50 atomic % to 70 atomic %, 0.5 atomic % to 15 atomic %, 25 atomic % to 35 atomic %, and 0.1 atomic % to 10 atomic %, respectively. Further, silicon nitride oxide contains higher composition of nitrogen than that of oxygen, and measurements using RBS and HFS preferably show composition of oxygen, nitrogen, silicon, and hydrogen ranging from 5 atomic % to 30 atomic %, 20 atomic % to 55 atomic %, 25 atomic % to 35 atomic %, and 10 atomic % to 30 atomic %, respectively. Note that percentages of nitrogen, oxygen, silicon, and hydrogen fall within the ranges given above, where the total number of atoms contained in the silicon oxynitride or the silicon nitride oxide is defined as 100 atomic %.

Note that in the case of forming the gate insulating layer 104 using silicon nitride, a thin silicon oxynitride layer is formed over the gate insulating layer 104, whereby deterioration that occurs at initial operation of a thin film transistor can be suppressed. Here, the silicon oxynitride layer may be formed extremely thin as long as the thickness is greater than or equal to 1 nm. The thickness is preferably greater than or equal to 1 nm and less than or equal to 3 nm.

Next, a method for forming the semiconductor layer 106 is described. The semiconductor layer 106 may be formed with a thickness of greater than or equal to 2 nm and less than or equal to 60 nm, preferably greater than or equal to 10 nm and less than or equal to 30 nm.

Further, as described above, the semiconductor layer 106 includes inverted conical or inverted pyramidal crystal particles. For example, the inverted conical or inverted pyramidal crystal particle can be formed while nuclei generation of the crystal particles is controlled in such a manner that the concentration of oxygen in the semiconductor layer 106 is reduced, the concentration of nitrogen is made higher than the concentration of oxygen, and the concentration of nitrogen is reduced in accordance with a growth direction of the crystal particle. Here, it is preferable that the concentration of nitrogen be one or more digits higher than the concentration of oxygen. More specifically, the concentration of oxygen and the concentration of nitrogen at the interface between the gate insulating layer 104 and the semiconductor layer 106, which are measured by SIMS, are less than or equal to $5\times10^{18}$ cm$^{-3}$ and greater than or equal to $1\times10^{20}$ cm$^{-3}$ and less than or equal to $1\times10^{21}$ cm$^{-3}$ respectively. Further, the inverted conical or inverted pyramidal crystal particle is formed in such a manner that the concentration of oxygen is kept low and the concentration of nitrogen is made higher than the concentration of oxygen.

One method in which the concentration of oxygen is kept low and the concentration of nitrogen is made higher than the concentration of oxygen is a method in which a large amount of nitrogen is allowed to be included on the surface of the gate insulating layer 104 before formation of the semiconductor layer 106. In order that the surface of the gate insulating layer 104 includes a large amount of nitrogen, after formation of the gate insulating layer 104 and before formation of the semiconductor layer 106, the surface of the gate insulating layer 104 may be processed with plasma generated by a gas including nitrogen. Here, as a gas including nitrogen, ammonia can be given, for example.

Another method in which the concentration of oxygen is kept low and the concentration of nitrogen is made higher than the concentration of oxygen is a method in which nitrogen is included at a high concentration in the gate insulating layer 104 which is in contact with the semiconductor layer 106. Accordingly, the gate insulating layer 104 needs to be formed using silicon nitride. Note that this method will be described in Embodiment 2.

Another method in which the concentration of oxygen is kept low and the concentration of nitrogen is made higher than the concentration of oxygen is a method in which an inner wall of a treatment chamber used for forming the semiconductor layer 106 is covered with a film including nitrogen at a high concentration. As a material including nitrogen at a high concentration, silicon nitride can be given, for example. Note that a film which includes nitrogen at a high concentration and covers the inner wall of the treatment chamber is preferably formed at the same time as the gate insulating layer 104 because a step can be simplified. Further, in this case, the gate insulating layer 104 and the semiconductor layer 106 are formed in the same treatment chamber; therefore, a manufacturing apparatus can be downsized. Note that this method will be described in Embodiment 3.

Another method in which the concentration of oxygen is kept low and the concentration of nitrogen is made higher than the concentration of oxygen is a method in which the concentration of oxygen contained in a gas used for forming the semiconductor layer 106 is kept low and the concentration of nitrogen is made high. At this time, only a gas used at the early stage of formation of a film to be the semiconductor layer 106 may be supplied with nitrogen. Alternatively, the amount of nitrogen to be supplied may be reduced gradually. Note that this method will be described in Embodiment 4.

In order that the concentration of oxygen is kept low and the concentration of nitrogen is made higher than the concentration of oxygen, any of the methods described above or a combination thereof may be used. In this embodiment, the gate insulating layer 104 has a structure in which a silicon oxynitride layer is stacked over a silicon nitride layer. The gate insulating layer 104 is exposed to ammonia, whereby the surface of the gate insulating layer 104 is supplied with nitrogen.

Figure 6:
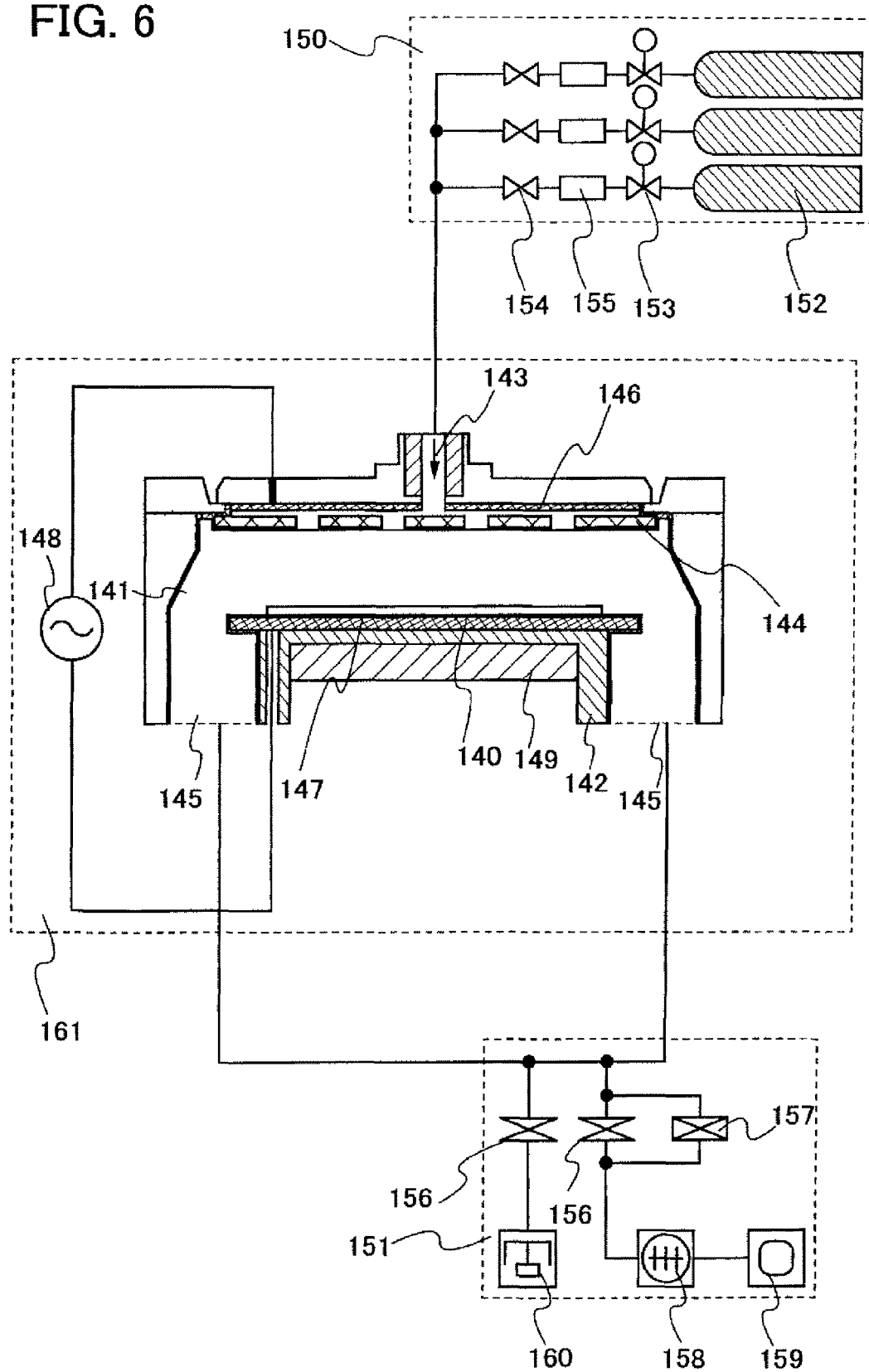
FIG. 6 is a view illustrating an apparatus which can be applied to a method for manufacturing a thin film transistor.

Here, an example of forming the gate insulating layer 104, the semiconductor layer 106, the source and drain regions 110 is described in detail. These layers are formed by a CVD method or the like. Further, the gate insulating layer 104 has a stacked-layer structure in which a silicon oxynitride layer is formed over a silicon nitride layer. By employing such a structure, the silicon nitride layer can prevent an element included in the substrate which adversely affects electric characteristics (an element such as sodium in the case where the substrate is a glass substrate) from entering the semiconductor layer 106 or the like. FIG. 6 is a schematic view illustrating a CVD apparatus which is used for forming these layers.

A plasma CVD apparatus 161 illustrated in FIG. 6 is connected to a gas supply means 150 and an exhaust means 151.

The plasma CVD apparatus 161 illustrated in FIG. 6 includes a treatment chamber 141, a stage 142, a gas supply portion 143, a shower plate 144, an exhaust port 145, an upper electrode 146, a lower electrode 147, an alternate-current power source 148, and a temperature control portion 149.

The treatment chamber 141 is formed using a material having rigidity and the inside thereof can be evacuated to vacuum. The treatment chamber 141 is provided with the upper electrode 146 and the lower electrode 147. Note that in FIG. 6, a structure of a capacitive coupling type (a parallel plate type) is illustrated; however, another structure such as that of an inductive coupling type can be used, as long as plasma can be generated in the treatment chamber 141 by applying two or more different high-frequency powers.

When treatment is performed with the plasma CVD apparatus illustrated in FIG. 6, a given gas is introduced from the gas supply portion 143. The introduced gas is introduced into the treatment chamber 141 through the shower plate 144. High-frequency power is applied with the alternate-current power source 148 connected to the upper electrode 146 and the lower electrode 147 to excite the gas in the treatment chamber 141, whereby plasma is generated. Further, the gas in the treatment chamber 141 is exhausted through the exhaust port 145 which is connected to a vacuum pump. Further, the temperature control portion 149 makes it possible to perform plasma treatment while an object to be processed is being heated.

The gas supply means 150 includes a cylinder 152 which is filled with a reactive gas, a pressure adjusting valve 153, a stop valve 154, a mass flow controller 155, and the like. The treatment chamber 141 includes a shower plate which is processed in a plate-like shape and provided with a plurality of pores, between the upper electrode 146 and the substrate 100. A reactive gas introduced into the upper electrode 146 is introduced into the treatment chamber 141 from these pores through an inner hollow structure.

The exhaust means 151 which is connected to the treatment chamber 141 has a function of vacuum evacuation and a function of controlling the pressure inside the treatment chamber 141 to be maintained at a predetermined level when a reactive gas is made to flow. The exhaust means 151 includes in its structure a butterfly valve 156, a conductance valve 157, a turbo molecular pump 158, a dry pump 159, and the like. In the case of arranging the butterfly valve 156 and the conductance valve 157 in parallel, the butterfly valve 156 is closed and the conductance valve 157 is operated, so that the evacuation speed of the reactive gas is controlled and thus the pressure in the treatment chamber 141 can be kept in a predetermined range. Moreover, the butterfly valve 156 having higher conductance is opened, so that high-vacuum evacuation can be performed.

In the case of performing ultra-high vacuum evacuation up to a pressure lower than $10^{-5}$ Pa on the treatment chamber 141, a cryopump 160 is preferably used together. Alternatively, when exhaust is performed up to ultra-high vacuum as ultimate vacuum, the inner wall of the treatment chamber 141 may be polished into a mirror surface, and the treatment chamber 141 may be provided with a heater for baking in order to reduce deflation from the inner wall.

Note that as illustrated in FIG. 6, when precoating treatment is performed so that a film is formed (deposited) so as to cover the entire treatment chamber 141, it is possible to prevent an impurity element attached to the inner wall of the treatment chamber 141 or an impurity element for forming the inner wall of the treatment chamber 141 from mixing into an element. In this embodiment, as precoating treatment, a film containing silicon as its main component may be formed. For example, an amorphous silicon film or the like may be formed. Note that it is preferable that this film does not include oxygen.

A series of steps from a step of forming the gate insulating layer 104 to a step of forming a semiconductor layer 109 including an impurity element which serves as a donor (also referred to as a semiconductor layer including an impurity element imparting one conductivity type), will be described with reference to FIG. 7. Note that the gate insulating layer 104 is formed in such a manner that a silicon oxynitride layer is stacked over a silicon nitride layer.

First, the substrate over which the gate electrode layer 102 is formed is heated in the treatment chamber 141 of the CVD apparatus, and source gases used for forming a silicon nitride layer are introduced into the treatment chamber 141 ("pretreatment A1" in FIG. 7). Here, as an example, a silicon nitride layer with a thickness of about 110 nm is formed in such a manner that the source gases are introduced and the flow rate of the source gases is stabilized, where the flow rate of $SiH_4$ is 40 sccm, the flow rate of $H_2$ is 500 sccm, the flow rate of $N_2$ is 550 sccm, and the flow rate of $NH_3$ is 140 sccm, and plasma discharge of 370 W is performed, where the pressure in the treatment chamber 141 is 100 Pa and the temperature of the substrate is 280° C. After that, only introduction of $SiH_4$ is stopped, and after several seconds, plasma discharge is stopped ("formation of a SiNx layer B1" in FIG. 7). This is because if plasma discharge is stopped in a state where $SiH_4$ is present in the treatment chamber 141, grains or powders containing silicon as its main component are formed, which causes reduction in yield. Note that either a $N_2$ gas or a $NH_3$ gas may be used. When a mixed gas thereof is used, a flow rate thereof may be adjusted as appropriate. Further, introduction of a $H_2$ gas and a flow rate thereof is adjusted as appropriate, and if not necessary, a $H_2$ gas is not necessarily introduced.

Next, the source gases used for forming the silicon nitride film are exhausted and source gases used for forming a silicon oxynitride film are introduced into the treatment chamber 141 ("replacement of gases C1" in FIG. 7). Here, as an example, a silicon oxynitride layer with a thickness of about 110 nm is formed in such a manner that the source gases are introduced and the flow rate thereof is stabilized, where the flow rate of $SiH_4$ is 30 sccm and the flow rate of $N_2O$ is 1200 sccm, and plasma discharge of 50 W is performed, where the pressure in the treatment chamber 141 is 40 Pa and the temperature of the substrate is 280° C. After that, in a manner similar to that of the silicon nitride layer, only introduction of $SiH_4$ is stopped, and after several seconds, plasma discharge is stopped ("formation of a SiOxNy layer D1" in FIG. 7).

Through the above steps, the gate insulating layer 104 can be formed. After the gate insulating layer 104 is formed, the substrate 100 is carried out from the treatment chamber 141 ("unloading E1" in FIG. 7).

After the substrate 100 is carried out from the treatment chamber 141, for example, a $NF_3$ gas is introduced into the treatment chamber 141 and the inside of the treatment chamber 141 is cleaned ("cleaning treatment F1" in FIG. 7). After that, treatment for forming an amorphous silicon layer in the treatment chamber 141 is performed ("precoating treatment G1" in FIG. 7). Here, a method for forming an amorphous silicon film is described. Source gases used for forming an amorphous silicon layer are introduced into the treatment chamber 141. Here, as an example, a semiconductor layer with a thickness of about 150 nm is formed in such a manner that the source gases are introduced and stabilized, where the flow rate of $SiH_4$ is 280 sccm and the flow rate of $H_2$ is 300 sccm, and plasma discharge of 60 W is performed, where the pressure in the treatment chamber 141 is 170 Pa and the temperature of the substrate is 280° C. After that, in a similar manner to the case of forming the silicon nitride layer or the like, only introduction of $SiH_4$: is stopped, and after several seconds, plasma discharge is stopped. After that, these gases are exhausted and a gas used for forming the semiconductor layer 109 including an impurity element which serves as a donor is introduced ("replacement of gases L1" in FIG. 7). By this treatment, an amorphous silicon layer is formed on the inner wall of the treatment chamber 141. Alternatively, precoating treatment may be performed using silicon nitride. The treatment in this case is similar to the treatment for forming the gate insulating layer 104. After that, the substrate 100 is carried into the treatment chamber 141 ("loading N1" in FIG. 7).

Next, the surface of the gate insulating layer 104 is supplied with nitrogen. Here, by exposing the gate insulating layer 104 to an ammonia gas, the surface of the gate insulating layer 104 is supplied with nitrogen ("flushing treatment I1" in FIG. 7). Further, hydrogen may be contained in the ammonia gas. Here, as an example, the pressure in the treatment chamber 141 is about 20 Pa to 30 Pa, and the substrate temperature is 280° C., and the treatment time is 60 seconds. Note that in the treatment of this step, only exposure to an ammonia gas is performed; however, plasma treatment may be performed. After that, the gases used for the above treatment is exhausted, and source gases used for forming a semiconductor layer 105 are introduced into the treatment chamber 141 ("replacement of gases J1" in FIG. 7).

Next, the semiconductor layer 105 is formed over an entire surface of the gate insulating layer 104 which is supplied with nitrogen. In a later step, the semiconductor layer 105 is patterned into the semiconductor layer 106. First, the source gases used for forming the semiconductor layer 105 are introduced into the treatment chamber 141. Here, as an example, a semiconductor layer with a thickness of about 50 nm is formed in such a manner that the source gases are introduced and the flow rate thereof is stabilized, where the flow rate of $SiH_4$ is 10 sccm and the flow rate of $H_2$ is 1500 sccm, and plasma discharge of 50 W is performed, where the pressure in the treatment chamber 141 is 280 Pa and the temperature of the substrate is 280° C. After that, in a manner similar to that of the silicon nitride layer or the like described above, only introduction of $SiH_4$ is stopped, and after several seconds, plasma discharge is stopped ("formation of a semiconductor layer K1" in FIG. 7). After that, these gases are exhausted and a gas used for forming the semiconductor layer 109 including an impurity element which serves as a donor is introduced ("replacement of gases L1" in FIG. 7). Note that without being limited thereto, replacement of gases is not necessarily performed.

In the above example, in the source gases used for forming the semiconductor layer 105, the flow rate ratio of $H_2$ to $SiH_4$ is about 150:1. Therefore, silicon is deposited gradually.

The surface of the gate insulating layer 104 in this embodiment is supplied with nitrogen. As described above, nitrogen suppresses generation of silicon crystal nuclei. Therefore, at the early stage of formation of the semiconductor layer 105, a silicon crystal nucleus is not generated. The layer which is formed at the early stage of formation of the semiconductor layer 105 is the first region 120 illustrated in FIG. 2. Since the semiconductor layer 105 is formed under fixed conditions, the first region 120 and the second region 122 are formed under the same conditions. As described above, the surface of the gate insulating layer 104 is supplied with nitrogen, which is followed by the formation of the semiconductor layer 105, whereby a semiconductor layer containing nitrogen (the first region 120 illustrated in FIG. 2) is formed. In the semiconductor layer 105, the concentration of nitrogen is gradually decreased as the distance from the interface between the semiconductor layer 105 and the gate insulating layer 104 is increased. When the concentration of nitrogen is less than or equal to a constant value, crystal nuclei are generated. After that, the crystal nuclei grow, so that the crystal particles 121 are formed.

Next, the semiconductor layer 109 including an impurity element which serves as a donor is formed over an entire surface of the semiconductor layer 105. In a later step, the semiconductor layer 109 including an impurity element which serves as a donor is patterned into the source and drain regions 110. First, source gases used for forming the semiconductor layer 109 including an impurity element which serves as a donor are introduced into the treatment chamber 141. Here, as an example, a semiconductor layer with a thickness of about 50 nm is formed in such a manner that the source gases are introduced and the flow rate thereof is stabilized, where the flow rate of $SiH_4$ is 100 sccm and the flow rate of a mixed gas in which $PH_3$ is diluted with $H_2$ by 0.5 vol % is 170 sccm, and plasma discharge of 60 W is performed, where the pressure in the treatment chamber 141 is 280 Pa and the temperature of the substrate is 280° C. After that, in a manner similar to that of the silicon nitride layer or the like described above, only introduction of $SiH_4$ is stopped, and after several seconds, plasma discharge is stopped ("formation of an impurity semiconductor layer M1" in FIG. 7). After that, these gases are exhausted ("exhaust N1" in FIG. 7).

Figure 4A:
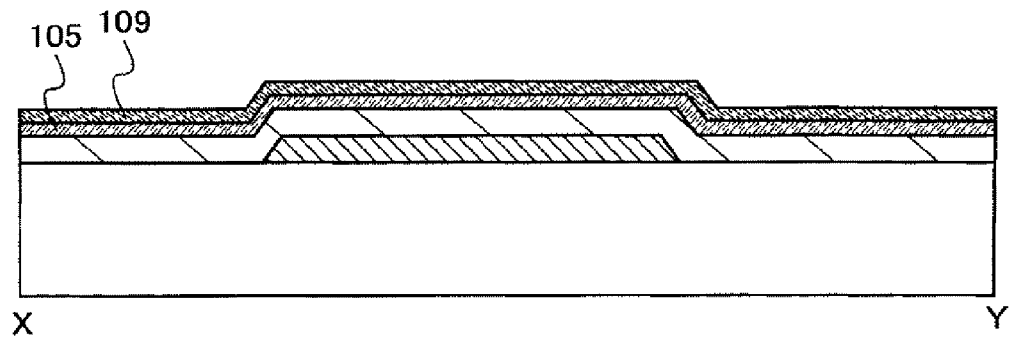
FIGS. 4A to 4C are views illustrating an example of a method for manufacturing a thin film transistor.

As described above, steps of forming components up to the semiconductor layer 109 including an impurity element which serves as a donor can be performed (see FIG. 4A).

Next, a conductive layer 111 is formed over the semiconductor layer 109 including an impurity element which serves as a donor.

The conductive layer 111 can be formed in a single layer or a stacked layer of aluminum, copper, titanium, neodymium, scandium, molybdenum, chromium, tantalum, tungsten, or the like. The conductive layer 111 may be formed using an aluminum alloy to which an element to prevent a hillock is added (e.g., an Al—Nd alloy or the like which can be used for the gate electrode layer 102). Alternatively, crystalline silicon to which an impurity element serving as a donor is added may be used. The conductive layer 111 may have a stacked-layer structure in which a layer, which is in contact with the crystalline silicon doped with an impurity element as a donor, is formed using titanium, tantalum, molybdenum, tungsten, or nitride of any of these elements and a layer of aluminum or an aluminum alloy is formed thereover. Further alternatively, the conductive layer 111 may have a stacked-layer structure of aluminum or an aluminum alloy which is sandwiched with titanium, tantalum, molybdenum, tungsten, or nitride of any of these elements. For example, the conductive layer 111 preferably has a three-layer structure in which an aluminum layer is sandwiched between molybdenum layers.

The conductive layer 111 is formed by a CVD method, a sputtering method, or a vacuum evaporation method. Further, the conductive layer 111 may be formed by discharging a conductive nanopaste of silver, gold, copper, or the like by a screen printing method, an inkjet method, or the like and baking the conductive nanopaste.

Figure 4B:
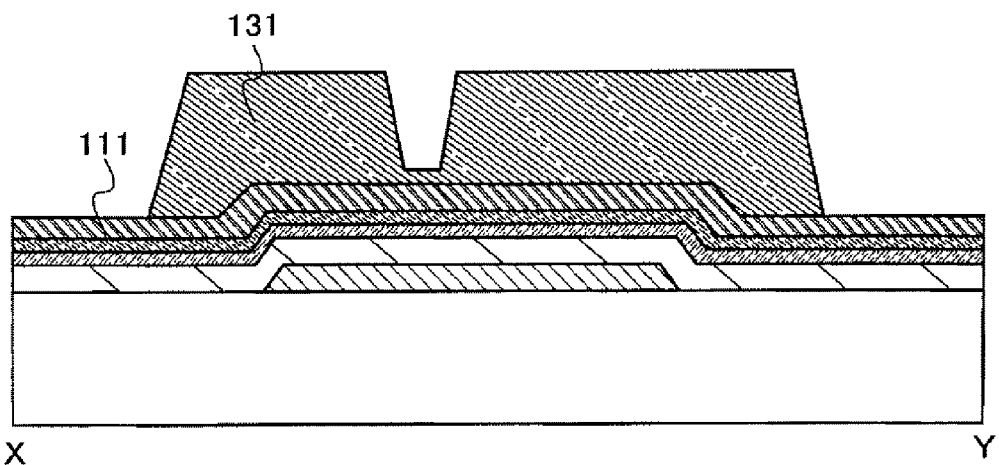

Next, a first resist mask 131 is formed over the conductive layer 111 (see FIG. 4B). The first resist mask 131 has two regions with different thicknesses and can be formed using a multi-tone mask. It is preferable to use the multi-tone mask since the number of photomasks to be used and the number of manufacturing steps can be reduced. In this embodiment, the resist mask formed using a multi-tone mask can be used in a step of forming a pattern of the semiconductor layer and a step of separating the semiconductor layer 109 into a source region and a drain region.

A multi-tone mask is a mask capable of light exposure with multi-level light intensity, and typically, light exposure is performed with three levels of light intensity to provide an exposed region, a half-exposed region, and an unexposed region. When the multi-tone mask is used, one-time light exposure and development process allows a resist mask with plural thicknesses (typically, two levels of thicknesses) to be formed. Therefore, by using a multi-tone mask, the number of photomasks can be reduced.

FIGS. 8A and 8B include cross-sectional views of typical multi-tone photomasks. FIG. 8A illustrates a gray-tone mask 180 and FIG. 8B illustrates a half-tone mask 185.

The gray-tone mask 180 illustrated in FIG. 8A includes a light-shielding portion 182 formed using a light-shielding film on a substrate 181 having a light-transmitting property, and a diffraction grating portion 183 provided with a pattern of the light-shielding film.

The diffraction grating portion 183 has slits, dots, meshes, or the like that is provided at intervals which are less than or equal to the resolution limit of light used for the exposure, whereby the light transmittance can be controlled. Note that the slits, dots, or mesh provided at the diffraction grating portion 183 may be provided periodically or non-periodically.

For the substrate 181 having a light-transmitting property, a quartz substrate or the like can be used. The light-shielding film for forming the light-shielding portion 182 and the diffraction grating portion 183 may be formed using a metal or a metal oxide, and chromium, chromium oxide, or the like is preferably used.

In the case where the gray-tone mask 180 is irradiated with light for light exposure, as illustrated in FIG. 8A, the transmittance in the region overlapping with the light-shielding portion 182 is 0%, and the transmittance in the region where both the light-shielding portion 182 and the diffraction grating portion 183 are not provided is 100%. Further, the transmittance at the diffraction grating portion 183 is basically in the range of 10% to 70%, which can be adjusted by the interval of slits, dots, or mesh of the diffraction grating, or the like.

The half-tone mask 185 illustrated in FIG. 8B includes a semi-light-transmitting portion 187 which is formed on a substrate 186 having a light-transmitting property, using a semi-light-transmitting film, and a light-shielding portion 188 formed using a light-shielding film.

The semi-light-transmitting portion 187 can be formed using a film of MoSiN, MoSi, MoSiO, MoSiON, CrSi, or the like. The light-shielding portion 188 may be formed using a metal or a metal oxide similar to the light-shielding film of the gray-tone mask, and chromium, chromium oxide, or the like is preferably used.

In the case where the half-tone mask 185 is irradiated with light for light exposure, as illustrated in FIG. 8B, the transmittance in the region overlapping with the light-shielding portion 188 is 0%, and the transmittance in the region where both the light-shielding portion 188 and the semi-light-transmitting portion 187 are not provided is 100%. Further, the transmittance in the semi-light-transmitting portion 187 is approximately in the range of 10% to 70%, which can be adjusted by the kind, the thickness, or the like of the material to be formed.

By light exposure using the multi-tone mask and development, a resist mask which includes regions having different thicknesses can be formed.

Figure 4C:
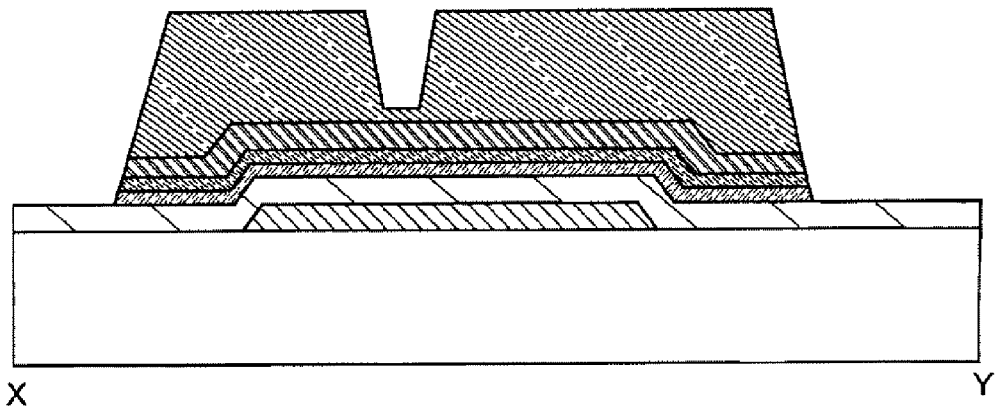

Next, with the use of the first resist mask 131, the semiconductor layer 105, the semiconductor layer 109 including an impurity element which serves as a donor, and the conductive layer 111 are etched. Through this step, the semiconductor layer 105, the semiconductor layer 109 including an impurity element which serves as a donor, and the conductive layer 111 are separated into each element (see FIG. 4C).

Here, the first resist mask 131 is eroded to form a second resist mask 132. Ashing using oxygen plasma may be performed in order that the resist mask is eroded.

Figure 5A:
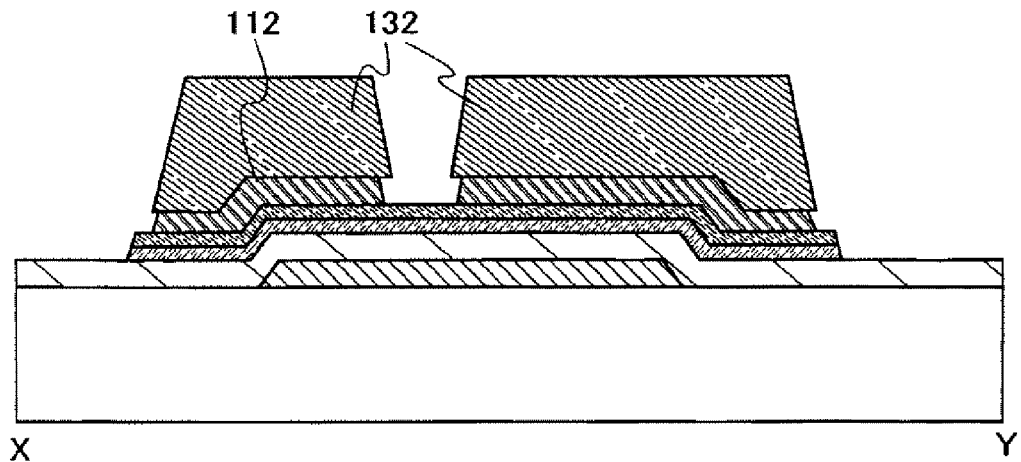
FIGS. 5A to 5C are views illustrating an example of a method for manufacturing a thin film transistor.

Next, with the use of the second resist mask 132, the conductive layer 111 is etched to form the wiring layers 112 (see FIG. 5A). The wiring layers 112 form the source and drain electrodes. It is preferable that this etching of the conductive layer 111 be performed by wet etching. By wet etching, the conductive layer is selectively etched, a side surface of the conductive layer recedes to an inner side than that of the second resist mask 132, and thus the wiring layers 112 are formed. Accordingly, the side surfaces of the wiring layers 112 and the side surfaces of the etched semiconductor layer 109 including an impurity element which serves as a donor are not coplanar, and the side surfaces of the source and drain regions 110 are formed outside of the side surfaces of the wiring layers 112. The wiring layers 112 serve not only as source and drain electrodes but also as a signal line. However, without limitation thereto, a signal line may be provided separately from the wiring layer 112.

Figure 5B:
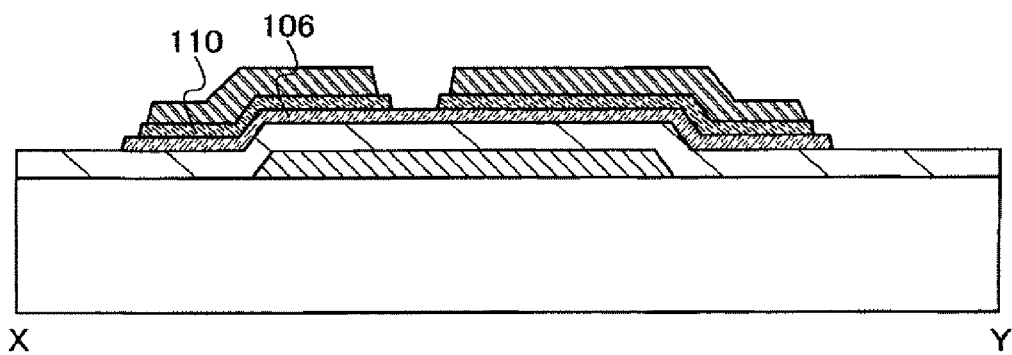

Next, in a state where the second resist mask 132 is left, the semiconductor layer 109 including an impurity element which serves as a donor is etched to form the source and drain regions 110 (see FIG. 5B).

Next, in a state where the second resist mask 132 is left, dry etching is preferably performed. Here, a condition of dry etching is set so that the exposed region of the semiconductor layer 106 is not damaged and the etching rate with respect to the semiconductor layer 106 can be low. In other words, a condition which gives almost no damages to the exposed surface of the semiconductor layer 106 and hardly reduces the thickness of the exposed region of the semiconductor layer 106 is applied. As an etching gas, a $Cl_2$ gas or the like can be used. There is no particular limitation on an etching method, and an ICP method, a CCP method, an ECR method, a reactive ion etching (RIE) method, or the like can be used.

An example of conditions of dry etching which can be used here is as follows: the flow rate of $Cl_2$ gas is 100 sccm; the pressure in a chamber is 0.67 Pa; the to temperature of the lower electrode is −10° C.; an RF power (13.56 MHz) of 2000 W is applied to the coil of the upper electrode to generate plasma; no power (i.e. non-biased 0 W), is applied to the substrate 100 side; and thus etching is performed for 30 seconds. The temperature of the inner wall of the chamber is preferably approximately 83° C.

Next, in a state where the second resist mask 132 is left, plasma treatment is preferably performed. Here, plasma treatment is preferably performed using water plasma, for example.

Water plasma treatment can be performed in such a manner that a gas containing water typified by water vapor ($H_2O$ vapor) as its main component is introduced into a reaction space to generate plasma. The second resist mask 132 can be removed with water plasma. Further, when water plasma treatment is performed or water plasma treatment is performed after exposure to air, an oxide film is formed in some cases.

Note that without the use of water plasma treatment, dry etching may be performed under such a condition that the exposed region of the semiconductor layer 106 is not damaged and an etching rate with respect to the semiconductor layer 106 is low.

As described above, after the pair of source and drain regions 110 are formed, dry etching is further performed under such a condition that the semiconductor layer 106 is not damaged, whereby an impurity element such as a residue existing on the exposed region of the semiconductor layer 106 can be removed. Further, dry etching is performed, and then water plasma treatment is sequentially performed, whereby the second resist mask 132 can also be removed. By water plasma treatment, insulation between the source region and the drain region can be secured, and thus, in a thin film transistor which is completed, the off-state current can be reduced, the on-state current can be increased, and variation in the electric characteristics can be reduced.

Note that order of steps of plasma treatment and the like are not limited thereto. After the second resist mask 132 is removed, etching in the absence of bias or plasma treatment may be performed.

Figure 5C:
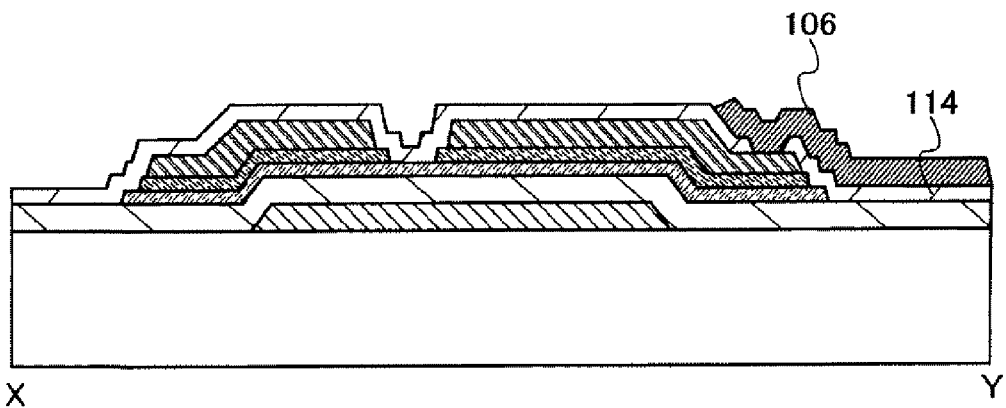

As described above, a thin film transistor according to this embodiment can be manufactured (see FIG. 5B). The thin film transistor according to this embodiment can be applied to a switching transistor provided in a pixel of a display device typified by a liquid crystal display device. In this case, the insulating layer 114 having an opening is formed so as to cover this thin film transistor and the pixel electrode layer 116 is formed so as to be connected to the source electrode or the drain electrode which is formed using the wiring layers 112 in the opening (see FIG. 5C). The opening can be formed by a photolithography method. After that, the pixel electrode layer 116 is formed over the insulating layer 114 so as to be connected through the opening. Thus, a switching transistor provided in the pixel of a display device, which is illustrated in FIG. 1, can be manufactured.

Note that the insulating layer 114 can be formed in a manner similar to that of the gate insulating layer 104. Silicon nitride is preferably used to form the dense insulating layer 114 in order to prevent entry of a contaminant impurity element such as an organic substance, a metal, or moisture floating in the atmosphere.

Note that the pixel electrode layer 116 can be formed using a conductive composition including a conductive macromolecule (also referred to as a conductive polymer) having a light-transmitting property. The pixel electrode layer 116 preferably has a sheet resistance of less than or equal to 10000 $\Omega/cm^2$ and a light transmittance of greater than or equal to 70% at a wavelength of 550 nm. Further, the resistance of the conductive macromolecule included in the conductive composition is preferably less than or equal to 0.1 $\Omega \cdot cm$.

As a conductive macromolecule, a so-called π electron conjugated conductive macromolecule can be used. For example, polyaniline and/or a derivative thereof, polypyrrole and/or a derivative thereof, polythiophene and/or a derivative thereof, and a copolymer of two or more kinds of those materials can be given.

The pixel electrode layer 116 can be formed using indium oxide including tungsten oxide, indium zinc oxide including tungsten oxide, indium oxide including titanium oxide, indium tin oxide including titanium oxide, indium tin oxide (hereinafter also referred to as ITO), indium zinc oxide, indium tin oxide to which silicon oxide is added, or the like.

The pixel electrode layer 116 may be etched by a photolithography method to be patterned in a manner similar to that of the wiring layer 112 or the like.

Note that although not illustrated, an insulating layer formed using an organic resin by a spin coating method or the like may be formed between the insulating layer 114 and the pixel electrode layer 116.

Thus, as described in this embodiment, a thin film transistor having high on-state current can be obtained.

Embodiment 2

In this embodiment, a method for manufacturing the thin film transistor illustrated in FIG. 1, which is different from the method described in Embodiment 1, will be described. In this embodiment, as in Embodiment 1, a semiconductor layer including inverted conical or inverted pyramidal crystal particles is formed. However, a method in which nitrogen is included in the semiconductor layer is different from that described in Embodiment 1.

In this embodiment, the gate insulating layer which is in contact with the semiconductor layer is formed using silicon nitride, whereby the concentration of nitrogen in the semiconductor layer is controlled, and the semiconductor layer including inverted conical or inverted pyramidal crystal particles is formed. A series of steps from a step of forming the gate insulating layer 104 to a step of forming the semiconductor layer 109 including an impurity element which serves as a donor will be described hereinafter with reference to FIG. 9.

Figure 9:
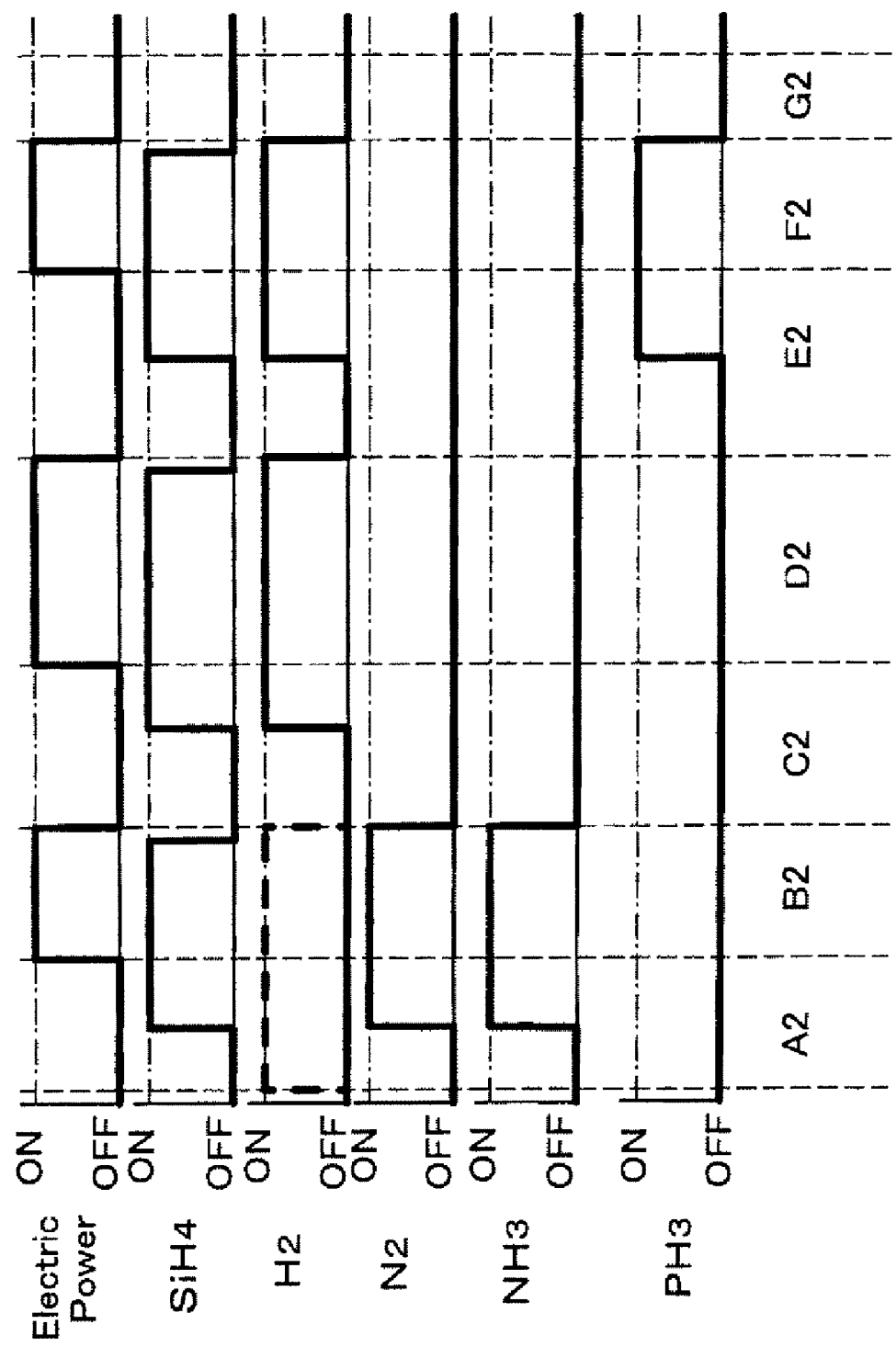
FIG. 9 is a view showing an example of a method for manufacturing a thin film transistor.

First, the substrate over which the gate electrode layer 102 is formed is heated in the treatment chamber 141 of the CVD apparatus, and a source gas used for forming a silicon nitride layer is introduced into the treatment chamber 141 ("pretreatment A2" in FIG. 9). Here, as an example, a silicon nitride layer with a thickness of about 300 nm is formed in such a manner that the source gases are introduced and the flow rate thereof is stabilized, where the flow rate of $SiH_4$ is 40 sccm, the flow rate of $H_2$ is 500 sccm, the flow rate of $N_2$ is 550 sccm, and the flow rate of $NH_3$ is 140 sccm, and plasma discharge of 370 W is performed, where the pressure in the treatment chamber 141 is 100 Pa and the temperature of the substrate is 280° C. After that, only introduction of $SiH_4$ is stopped, and after several seconds, plasma discharge is stopped ("formation of a SiNx layer B2" in FIG. 9). Note that either a $N_2$ gas or a $NH_3$ gas may be used. When a mixed gas thereof is used, a flow rate thereof may be adjusted as appropriate. Further, introduction of a $H_2$ gas and a flow rate thereof is adjusted as appropriate, and if not necessary, a $H_2$ gas is not necessarily introduced.

Next, the source gases used for forming the silicon nitride layer are exhausted and source gases used for forming the semiconductor layer 105 are introduced into the treatment chamber 141 ("replacement of gases C2" in FIG. 9).

Next, the semiconductor layer 105 is formed over the entire surface of the gate insulating layer 104. In a later step, the semiconductor layer 105 is patterned into the semiconductor layer 106. First, the source gases used for forming the semiconductor layer 105 are introduced into the treatment chamber 141. Here, as an example, a semiconductor layer with a thickness of about 50 nm is formed in such a manner that the source gases are introduced and flow rate thereof is stabilized, where the flow rate of $SiH_4$ is 10 sccm and the flow rate of $H_2$ is 1500 sccm, and plasma discharge of 50 W is performed, where the pressure in the treatment chamber 141 is 280 Pa and the temperature of the substrate is 280° C. After that, in a similar manner to that of the case of forming the silicon nitride layer or the like, only introduction of $SiH_4$ is stopped, and after several seconds, plasma discharge is stopped ("formation of a semiconductor layer D2" in FIG. 9). After that, these gases are exhausted and gases used for forming the semiconductor layer 109 including an impurity element which serves as a donor are introduced ("replacement of gases E2" in FIG. 9). Note that without being limited thereto, replacement of gases is not necessarily performed.

In the above example, in the source gases used for forming the semiconductor layer 105, the flow rate ratio of $H_2$ to $SiH_4$ is about 150:1, and thus, silicon is deposited gradually.

Since the gate insulating layer 104, which is in contact with the semiconductor layer 105 is formed using silicon nitride in this embodiment, a large amount of nitrogen is present on the surface of the gate insulating layer 104. As described above, nitrogen suppresses generation of silicon crystal nuclei. Therefore, at the early stage of formation of the semiconductor layer 105, a silicon crystal nucleus is not generated. The layer which is formed at the early stage of formation of the semiconductor layer 105 is the first region 120 illustrated in FIG. 2. Since the semiconductor layer 105 is formed under fixed conditions, the first region 120 and the second region 122 are formed under the same conditions. As described above, since the gate insulating layer 104 is formed using silicon nitride, the semiconductor layer 105 over the gate insulating film 104 can include nitrogen (the first region 120 illustrated in FIG. 2). In the semiconductor layer 105, the concentration of nitrogen is gradually decreased as the distance from the interface between the semiconductor layer 105 and the gate insulating layer 104 is increased. When the concentration of nitrogen is less than or equal to a certain value, crystal nuclei are generated. After that, the crystal nuclei grow, so that the crystal particles 121 are formed. Note that here, in generation positions of the crystal nuclei, from which the crystal particles 121 start to grow, the concentration of nitrogen measured by SIMS is greater than or equal to $1 \times 10^{20}$ cm$^{-3}$ and less than or equal to $1 \times 10^{21}$ cm$^{-3}$, preferably greater than or equal to $2 \times 10^{20}$ cm$^{-3}$ and less than or equal to $7 \times 10^{20}$ cm$^{-3}$.

Note that as an impurity element which suppresses generation of crystal nuclei, an impurity element (e.g. nitrogen) in silicon, which does not trap carriers when it is included in silicon, is selected. On the other hand, a concentration of an impurity element (e.g. oxygen) which generates dangling bonds of silicon is reduced. Accordingly, the concentration of oxygen is preferably reduced without reducing the concentration of nitrogen. Specifically, it is preferable that the concentration of oxygen measured by SIMS be less than or equal to $5 \times 10^{18}$ cm$^{-3}$.

Next, the semiconductor layer 109 including an impurity element which serves as a donor is formed over an entire surface of the semiconductor layer 105. In a later step, the semiconductor layer 109 including an impurity element which serves as a donor is patterned into the source and drain regions 110. First source gases used for formation of the semiconductor layer 109 including an impurity element which serves as a donor are introduced into the treatment chamber 141. Here, as an example, a semiconductor layer including an impurity element which serves as a donor with a thickness of about 50 nm is formed in such a manner that the source gases are introduced and the flow rate thereof is stabilized, where the flow rate of $SiH_4$ is 100 sccm and the flow rate of a mixed gas in which $PH_3$ is diluted with $H_2$ by 0.5 vol % is 170 sccm, and plasma discharge of 60 W is performed, where the pressure in the treatment chamber 141 is 280 Pa and the temperature of the substrate is 280° C. After that, in a similar manner to that of the case of forming the silicon nitride layer or the like, only introduction of $SiH_4$: is stopped, and after several seconds, plasma discharge is stopped ("formation of an impurity semiconductor layer F2" in FIG. 9). After that, these gases are exhausted ("exhaust G2" in FIG. 9).

As described above, the uppermost layer of the gate insulating layer which is in contact with the semiconductor layer is formed using silicon nitride, whereby the concentration of oxygen can be low and the concentration of nitrogen can be higher than the concentration of oxygen, and thus the semiconductor layer containing inverted conical or inverted pyramidal crystal particles can be formed.

Embodiment 3

In this embodiment, a manufacturing method of the thin film transistor illustrated in FIG. 1, which is different from those of Embodiments 1 and 2, will be described. In this embodiment, as in Embodiments 1 and 2, a semiconductor layer including inverted conical or inverted pyramidal crystal particles is formed. However, a method in which nitrogen is contained in the semiconductor layer is different from those described in Embodiments 1 and 2.

In this embodiment, the treatment chamber 141 is cleaned before formation of the semiconductor layer and after that the inner wall of the chamber is covered with a silicon nitride layer, whereby nitrogen is made to be contained in the semiconductor layer, the concentration of oxygen is kept low and the concentration of nitrogen is made higher than the concentration of oxygen. A series of steps from a step of forming the gate insulating layer 104 to a step of forming the semiconductor layer 109 including an impurity element which serves as a donor will be described hereinafter with reference to FIG. 10.

Figure 10:
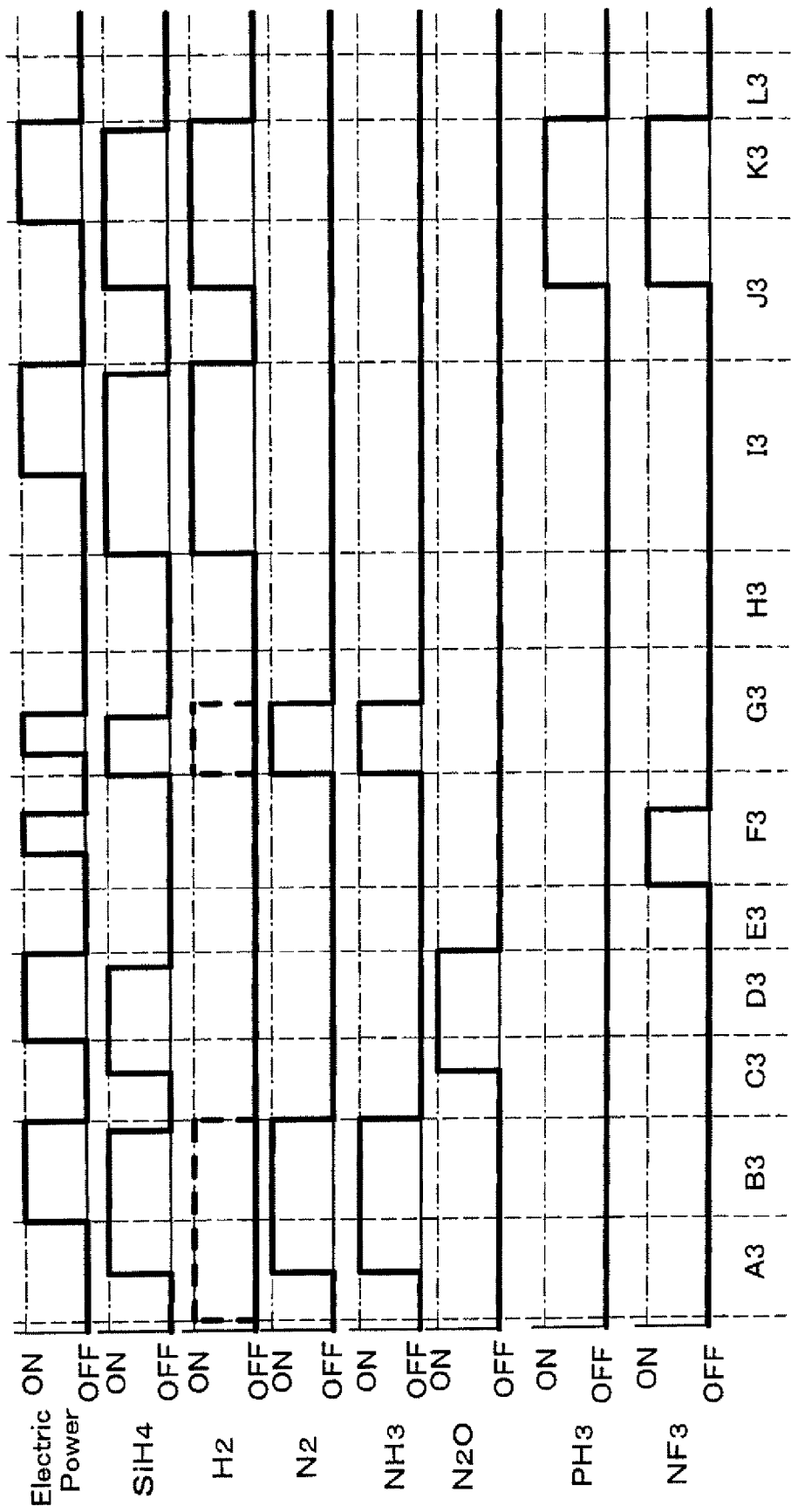
FIG. 10 is a view showing an example of a method for manufacturing a thin film transistor.

First, the substrate over which the gate electrode layer 102 is formed is heated in the treatment chamber 141 (the chamber) of the CVD apparatus, and in order to form a silicon nitride layer, source gases used for formation of the silicon nitride layer are introduced into the treatment chamber 141 ("pretreatment A3" in FIG. 10). Here, as an example, a silicon nitride layer with a thickness of about 110 nm is formed in such a manner that the source gases are introduced and the flow rate thereof is stabilized, where the flow rate of $SiH_4$ is 40 sccm, the flow rate of $H_2$ is 500 sccm, the flow rate of $N_2$ is 550 sccm, and the flow rate of $NH_3$ is 140 sccm, and plasma discharge of 370 W is performed, where the pressure in the treatment chamber 141 is 100 Pa and the temperature of the substrate is 280° C. After that, only introduction of $SiH_4$: is stopped, and after several seconds, plasma discharge is stopped ("formation of a SiNx layer B3" in FIG. 10). Note that either a $N_2$ gas or a $NH_3$ gas may be used. When a mixed gas thereof is used, a flow rate thereof may be adjusted as appropriate. Further, introduction of a $H_2$ gas and a flow rate thereof are adjusted as appropriate, and if not necessary, a $H_2$ gas is not necessarily introduced.

Next, the source gases used for forming the silicon nitride layer are exhausted and source gases used for forming a silicon oxynitride layer are introduced into the treatment chamber 141 ("replacement of gases C3" in FIG. 10). Here, as an example, a silicon oxynitride layer with a thickness of about 110 nm is formed in such a manner that the source gases are introduced and stabilized, where the flow rate of $SiH_4$ is 30 sccm and the flow rate of $N_2O$ is 1200 sccm, and plasma discharge of 50 W is performed, where the pressure in the treatment chamber 141 is 40 Pa and the temperature of the substrate is 280° C. After that, in a similar manner to the silicon nitride layer, only introduction of $SiH_4$ is stopped, and after several seconds, plasma discharge is stopped ("formation of a SiOxNy layer D3" in FIG. 10).

Through the above steps, the gate insulating layer 104 can be formed. After the gate insulating layer 104 is formed, the substrate 100 is carried out from the treatment chamber 141 ("unloading E3" in FIG. 10).

After the substrate 100 is carried out from the treatment chamber 141, a NF$_3$ gas is introduced into the treatment chamber 141 and the inside of the treatment chamber 141 is cleaned ("cleaning treatment F3" in FIG. 10). After that, in a manner similar to that of the case of forming the gate insulating layer 104, treatment for forming a silicon nitride layer is performed ("precoating treatment G3" in FIG. 10). By this treatment, the inner wall of the treatment chamber 141 is covered with the silicon nitride layer. After that, the substrate 100 is carried into the treatment chamber 141 and source gases used for forming the semiconductor layer 105 are introduced into the treatment chamber 141 ("loading H3" in FIG. 10).

Next, the semiconductor layer 105 is formed over the entire surface of the gate insulating layer 104. In a later step, the semiconductor layer 105 is patterned into the semiconductor layer 106. First, the source gases used for forming the semiconductor layer 105 are introduced into the treatment chamber 141. Here, as an example, a semiconductor layer with a thickness of about 50 nm is formed in such a manner that the source gases are introduced and the flow rate thereof is stabilized, where the flow rate of SiH$_4$ is 10 sccm and the flow rate of H$_2$ is 1500 sccm, and plasma discharge of 50 W is performed, where the pressure in the treatment chamber 141 is 280 Pa and the temperature of the substrate is 280° C. After that, in a manner similar to that of the case of forming the silicon nitride layer, only introduction of SiH$_4$ is stopped, and after several seconds, plasma discharge is stopped ("formation of a semiconductor layer I3" in FIG. 10). After that these gases are exhausted and a gas used for forming the semiconductor layer 109 including an impurity element which serves as a donor are introduced ("replacement of gases J3" in FIG. 10). Note that without being limited thereto, replacement of gases is not necessarily performed.

In the above example, in the source gases used for forming the semiconductor layer 105, the flow rate ratio of H2 to SiH$_4$ is about 150:1, and thus, silicon is deposited gradually.

The surface of the gate insulating layer 104 is supplied with nitrogen from the inner wall of the treatment chamber 141 which is covered with the silicon nitride layer in this embodiment. As described above, nitrogen suppresses generation of silicon crystal nuclei. Therefore, at the early stage of formation of the semiconductor layer 105, a silicon crystal nucleus is not generated. The layer which is formed at the early stage of formation of the semiconductor layer 105 is the first region 120 illustrated in FIG. 2. Since the semiconductor layer 105 is formed under fixed conditions, the first region 120 and the second region 122 are formed under the same conditions. As described above, since the surface of the gate insulating layer 104 is supplied with nitrogen, the semiconductor layer 105 can include nitrogen (the first region 120 illustrated in FIG. 2). In the semiconductor layer 105, the concentration of nitrogen is gradually reduced as the distance from the interface between the semiconductor layer 105 and the gate insulating layer 104 is increased. When the concentration of nitrogen is less than or equal to a certain value, crystal nuclei are generated. After that the crystal nuclei grow, so that the crystal particles 121 are formed.

Next, the semiconductor layer 109 including an impurity element which serves as a donor is formed over an entire surface of the semiconductor layer 105. In a later step, the semiconductor layer 109 including an impurity element which serves as a donor is patterned into the source and drain regions 110. First, source gases used for forming the semiconductor layer 109 including an impurity element which serves as a donor are introduced into the treatment chamber 141. Here, as an example, a semiconductor layer with a thickness of about 50 nm is formed in such a manner that the source gases are introduced and the flow rate thereof is stabilized, where the flow rate of SiH$_4$ is 100 sccm and the flow rate of a mixed gas in which PH$_3$ is diluted with H$_2$ by 0.5 vol % is 170 sccm, and plasma discharge of 60 W is performed, where the pressure in the treatment chamber 141 is 280 Pa and the temperature of the substrate is 280° C. After that, in a manner similar to that of the case of forming the silicon nitride layer or the like, only introduction of SiH$_4$ is stopped, and after several seconds, plasma discharge is stopped ("formation of a semiconductor layer including an impurity element which serves as a donor K3" in FIG. 10). After that, these gases are exhausted ("exhaust L3" in FIG. 10).

As described above, the inner wall of the treatment chamber 141 is covered with the silicon nitride layer at least right before formation of the semiconductor layer 105, whereby the concentration of oxygen in the gate insulating layer 104 can be suppressed low and the concentration of nitrogen can be made higher than the concentration of oxygen in the gate insulating layer 104, and thus the semiconductor layer including inverted conical or inverted pyramidal crystal particles can be formed.

Further, the inner wall of the treatment chamber 141 is covered with a silicon nitride layer, whereby an element or the like included in the inner wall of the treatment chamber 141 can also be prevented from entering the semiconductor layer.

Note that in the above description, the gate insulating layer 104 is formed by stacking a silicon oxynitride layer over a silicon nitride layer; therefore, a mode is described in which cleaning treatment and precoating treatment are performed after the gate insulating layer 104 is formed. However, this embodiment may be implemented in combination with Embodiment 2. That is, the gate insulating layer 104 is formed using silicon nitride, and formation of the gate insulating layer 104 may also serve as precoating treatment, whereby the steps can be simplified and throughput can be improved.

Embodiment 4

In this embodiment, a method for manufacturing a semiconductor device, which is different from those of Embodiments 1 to 3, will be described. In this embodiment, as in Embodiment 1, a semiconductor layer including inverted conical or inverted pyramidal crystal particles is formed. However, a method in which nitrogen is contained in the semiconductor layer is different from those described in Embodiments 1 and 2.

In this embodiment, nitrogen is mixed into a gas used at the early stage of formation of the semiconductor layer, whereby the concentration of oxygen is kept low and the concentration of nitrogen is increased compared with the concentration of oxygen. A series of steps from a step of forming the gate insulating layer 104 to a step of forming the semiconductor layer 109 including an impurity element which serves as a donor will be described hereinafter with reference to FIG. 11.

Figure 11:
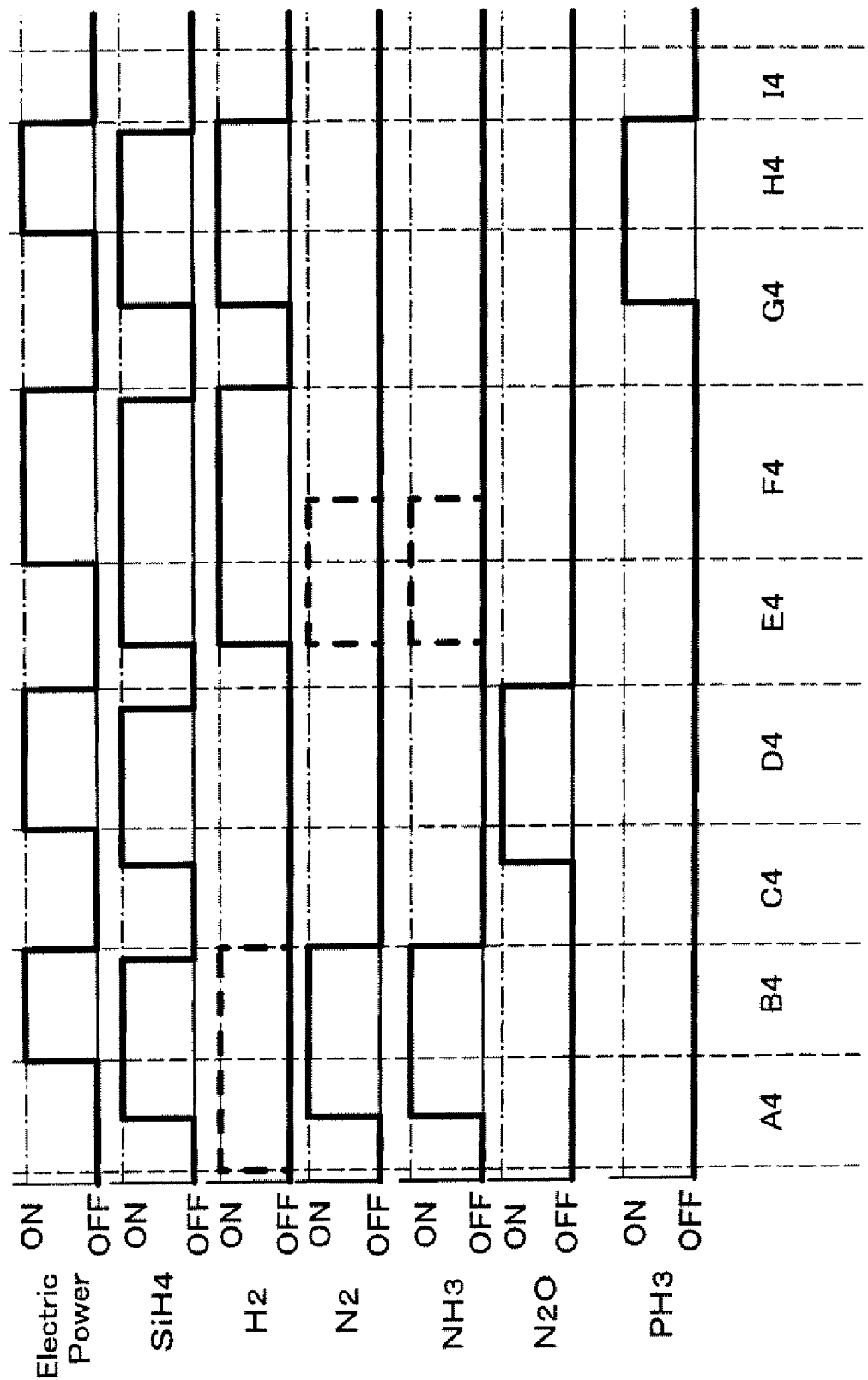
FIG. 11 is a view showing an example of a method for manufacturing a thin film transistor.

First, the substrate over which the gate electrode layer 102 is formed is heated in the treatment chamber 141 (i.e., in a chamber) of the CVD apparatus, and in order to form a silicon nitride layer, a source gas used for forming a silicon nitride layer is introduced into the treatment chamber 141 ("pretreatment A4" in FIG. 11). Here, as an example, a silicon nitride layer with a thickness of about 110 nm is formed in such a manner that the source gases are introduced and flow rate thereof is stabilized, where the flow rate of SiH$_4$ is 40 sccm, the flow rate of H$_2$ is 500 sccm, the flow rate of N$_2$ is 550 sccm, and the flow rate of NH$_3$ is 140 sccm, and plasma discharge of 370 W is performed, where the pressure in the treatment chamber 141 is 100 Pa and the temperature of the substrate is 280° C. After that, only introduction of SiH$_4$: is stopped, and after several seconds, plasma discharge is stopped ("formation of a SiNx layer B4" in FIG. 11). Note that either a N$_2$ gas or a NH$_3$ gas may be used. When a mixed gas thereof is used, a flow rate thereof may be adjusted as appropriate. Further, introduction of a H$_2$ gas and a flow rate thereof is adjusted as appropriate, and if not necessary, a H$_2$ gas is not necessarily introduced.

Next, the source gases used for forming the silicon nitride film are exhausted and source gases used for forming a silicon oxynitride layer are introduced into the treatment chamber 141 ("replacement of gases C4" in FIG. 11). Here, as an example a silicon oxynitride layer with a thickness of about 110 nm is formed in such a manner that the source gases are introduced and flow rate thereof is stabilized, where the flow rate of SiH$_4$ is 30 sccm and the flow rate of N$_2$O is 1200 sccm, and plasma discharge of 50 W is performed, where the pressure in the treatment chamber 141 is 40 Pa and the temperature of the substrate is 280° C. After that, in a manner similar to that of the silicon nitride layer, only introduction of SiH$_4$ is stopped, and after several seconds, plasma discharge is stopped ("formation of a SiOxNy layer D4" in FIG. 11). After that, these gases are exhausted and gases used for forming the semiconductor layer 105 are introduced ("replacement of gases E4" in FIG. 11).

Next, the semiconductor layer 105 is formed over an entire surface of the gate insulating layer 104. In a later step, the semiconductor layer 105 is patterned into the semiconductor layer 106. Here, as an example, a semiconductor layer with a thickness of about 50 nm is formed in such a manner that the source gases are introduced and the flow rate thereof is stabilized, where the flow rate of SiH$_4$ is 10 sccm, the flow rate of H$_2$ is 1500 sccm and the flow rate of N$_2$ is 1000 sccm, plasma discharge of 50 W is performed, where the pressure in the treatment chamber 141 is 280 Pa and the temperature of the substrate is 280° C., and after that, a semiconductor layer is allowed to be grown, where only the flow rate of N$_2$ is set to be 0 sccm. After that, in a manner similar to that of the case of forming the silicon nitride layer or the like, only introduction of SiH$_4$ is stopped, and after several seconds, plasma discharge is stopped ("formation of a semiconductor layer F4" in FIG. 11). After that, these gases are exhausted and gases used for forming the semiconductor layer 109 including an impurity element which serves as a donor are introduced ("replacement of gases G4" in FIG. 11). Note that instead of N$_2$, NH$_3$ may be used. Note that without being limited thereto, replacement of gases is not necessarily performed.

In the above example, in the source gases used for forming the semiconductor layer 105, the flow rate ratio of H$_2$ to SiH$_4$ is about 150:1, and thus, silicon is deposited gradually.

Nitrogen is included in the gas used at the early stage of formation of the semiconductor layer 105 in this embodiment. As described above, nitrogen suppresses generation of silicon crystal nuclei. Therefore, at the early stage of formation of the film, a silicon crystal nucleus is not generated. The layer which is formed at the early stage of formation of the semiconductor layer 105 is the first region 120 illustrated in FIG. 2. As described above, since nitrogen is included in the gas used at the early stage of formation of the semiconductor layer 105, the semiconductor layer 105 can include nitrogen (the first region 120 illustrated in FIG. 2). In the semiconductor layer 105, the concentration of nitrogen is gradually reduced as the distance from the interface between the semiconductor layer 105 and the gate insulating layer 104 is increased. When the concentration of nitrogen is less than or equal to a certain value, crystal nuclei are generated. After that, the crystal nuclei grow, so that the crystal particles 121 are formed.

Next, the semiconductor layer 109 including an impurity element which serves as a donor is formed over an entire surface of the semiconductor layer 105. In a later step, the semiconductor layer 109 including an impurity element which serves as a donor is patterned into the source and drain regions 110. First, source gases used for forming the semiconductor layer 109 including an impurity element which serves as a donor are introduced into the treatment chamber 141. Here, as an example, a semiconductor layer with a thickness of about 50 nm is formed in such a manner that the source gases are introduced and the flow rate thereof is stabilized, where the flow rate of SiH$_4$ is 100 sccm and the flow rate of a mixed gas in which PH$_3$ is diluted with H$_2$ by 0.5 vol % is 170 sccm, and plasma discharge of 60 W is performed, where the pressure in the treatment chamber 141 is 280 Pa and the temperature of the substrate is 280° C. After that, in a manner similar to that of the case of forming the silicon nitride layer or the like described above, only introduction of SiH$_4$ is stopped, and after several seconds, plasma discharge is stopped ("formation of an impurity semiconductor layer H4" in FIG. 11). After that, these gases are exhausted ("exhaust I4" in FIG. 11).

As described above, nitrogen is added to the gas used at the early stage of formation of the semiconductor layer, whereby the concentration of oxygen can be kept low and the concentration of nitrogen can be made higher than the concentration of oxygen, and thus the semiconductor layer including inverted conical or inverted pyramidal crystal particles can be formed.

Embodiment 5

In this embodiment, an example of a mode of a thin film transistor will be described with reference to the drawings. In this embodiment, a thin film transistor is formed without using a multi-tone mask.

Figure 12:
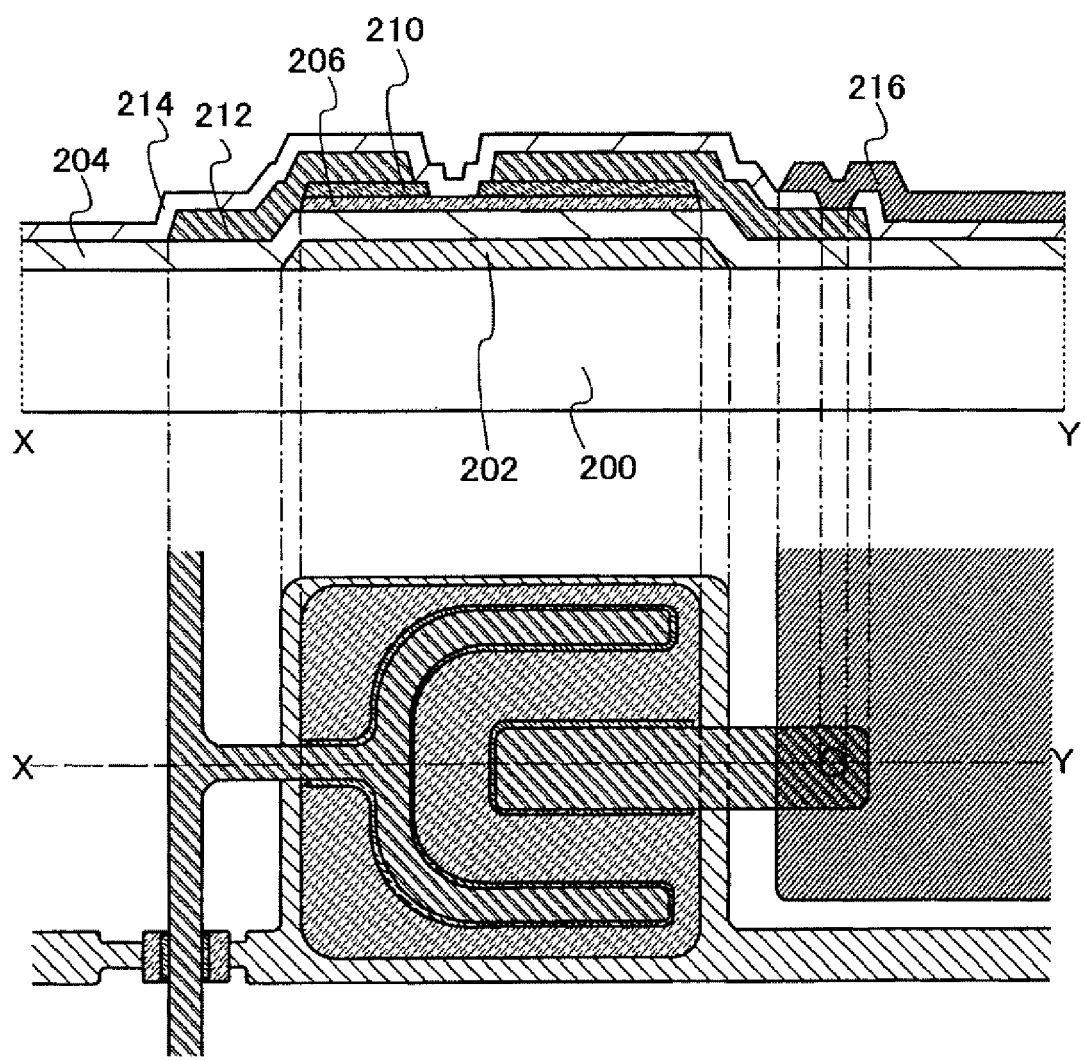
FIG. 12 is a view illustrating an example of a thin film transistor.

FIG. 12 is a top view and a cross-sectional view of a thin film transistor according to this embodiment. The thin film transistor illustrated in FIG. 12 includes a gate electrode layer 202 over a substrate 200; a gate insulating layer 204 covering the gate electrode layer 202; a semiconductor layer 206 provided over and in contact with the gate insulating layer 204; and source and drain regions 210 provided over and in contact with part of the semiconductor layer 206. Further, the thin film transistor includes wiring layers 212 provided over and in contact with the gate insulating layer 204 and the source and drain regions 210. The wiring layers 212 form a source and a drain electrode. The thin film transistor includes, over the wiring layers 212, an insulating layer 214 serving as a protective film. Further, each layer is patterned into a desired shape.

Note that the thin film transistor illustrated in FIG. 12 can be applied to a pixel transistor provided for a pixel portion of a liquid crystal display device, in a manner similar to that of the thin film transistor illustrated in FIG. 1. Therefore, in the example of FIG. 12, an opening is provided in the insulating layer 214, and a pixel electrode layer 216 is provided over the insulating layer 214 so that the pixel electrode layer 216 and the wiring layer 212 are connected to each other.

Further, one of the source and drain electrodes is formed so as to have a U shape (a reversed C shape or a horseshoe shape), and surrounds the other of the source and drain electrodes. Thus, the distance between the source and drain electrodes is kept almost constant (see FIG. 12).

The source and drain electrodes of the thin film transistor have the above-described shape, whereby a channel width of the thin film transistor can be increased, and thus the amount of current is increased. In addition, variation in electric characteristics can be reduced. Further, decrease in reliability due to misalignment of a mask pattern in a manufacturing process can be suppressed. However, without limitation thereto, one of the source and drain electrodes does not necessarily have a U shape.

The semiconductor layer 206 in this embodiment has features similar to those of the semiconductor layer 106 in Embodiment 1, and can be formed using a material and by a method which are similar to those of the semiconductor layer 106. Alternatively, the semiconductor layer 206 may be formed as described in Embodiments 2 to 4. Thus, detailed description on formation of the semiconductor layer 206 will be omitted in this embodiment.

Next, a method for manufacturing the thin film transistor illustrated in FIG. 12 is described. An n-channel thin film transistor has higher carrier mobility than a p-channel thin film transistor. It is preferable that all thin film transistors formed over one substrate have the same polarity because the number of manufacturing steps can be reduced. Therefore, in this embodiment, a method for manufacturing an n-channel thin film transistor is described.

Figure 13A:
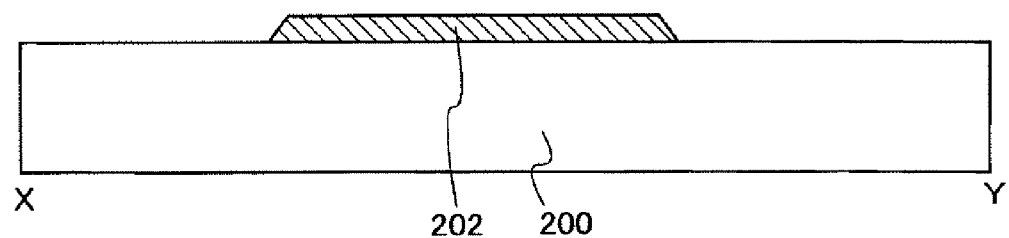
FIGS. 13A to 13C are views illustrating an example of a method for manufacturing a thin film transistor.

First, the gate electrode layer 202 is formed over the substrate 200 (see FIG. 13A).

As the substrate 200, a substrate similar to the substrate 100 in Embodiment 1 can be used.

The gate electrode layer 202 can be formed using a material and by a method which are similar to those of the gate electrode layer 102 in Embodiment 1.

Figure 13B:
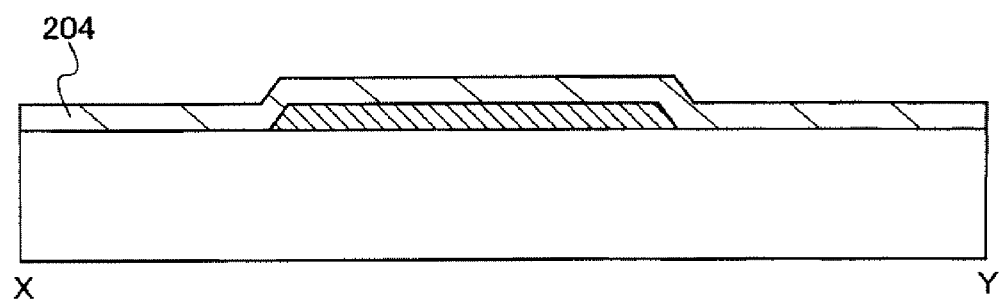

Next, the gate insulating layer 204 is formed so as to cover the gate electrode layer 202 (see FIG. 13B). The gate insulating layer 204 can be formed using a material and by a method which are similar to those of the gate insulating layer 104 in Embodiment 1.

Figure 13C:
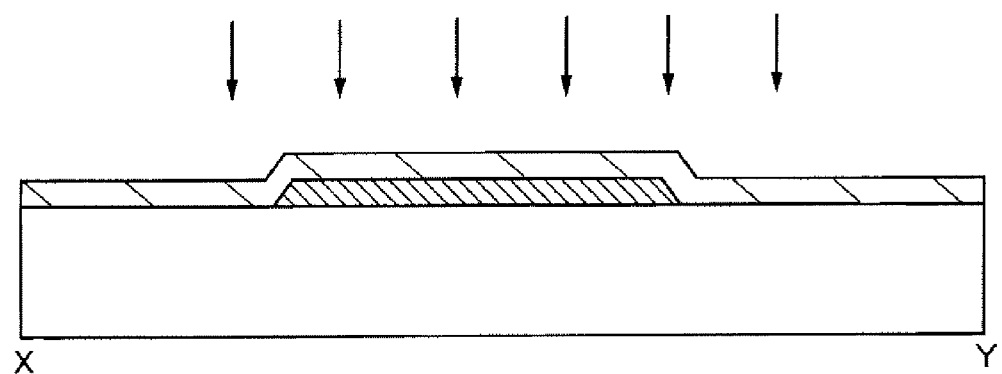

Here, treatment for supplying nitrogen may be performed on the gate insulating layer 204 (see FIG. 13C). As the treatment for supplying nitrogen, treatment of exposing the gate insulating layer 204 to a NH$_3$ gas, which is described in Embodiment 1, can be given as an example.

Figure 14A:
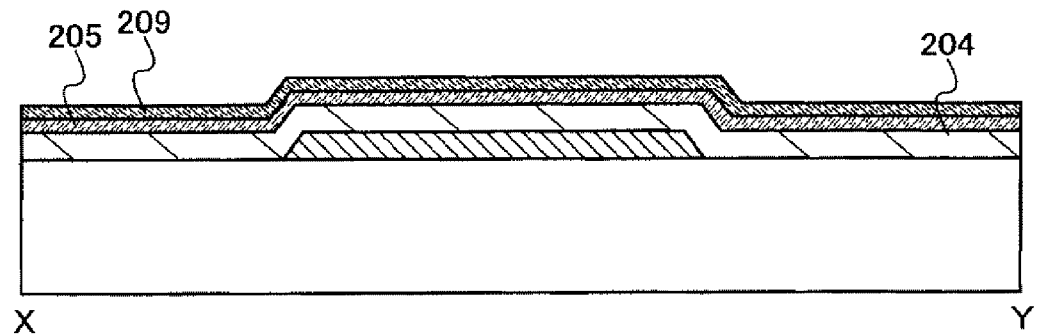
FIGS. 14A to 14C are views illustrating an example of a method for manufacturing a thin film transistor.
Figure 14B:
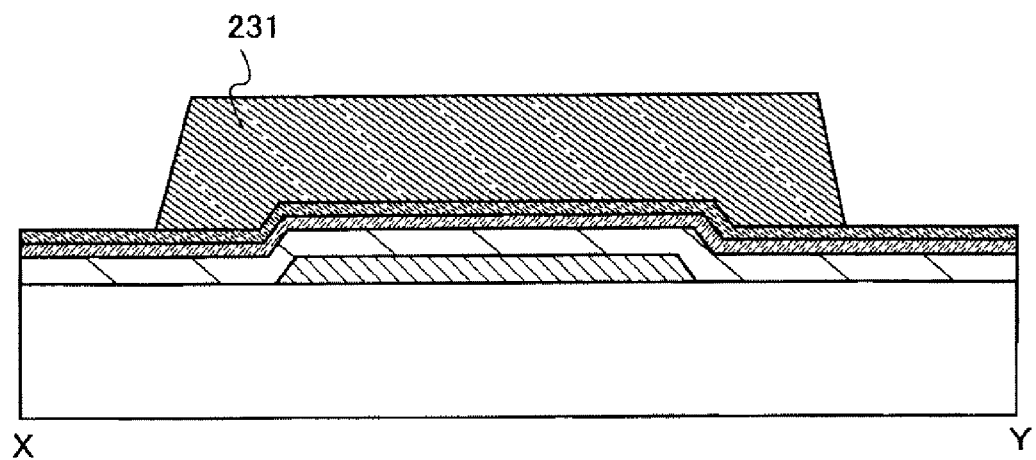

Next, a semiconductor layer 205 and a semiconductor layer 209 including an impurity element which serves as a donor are formed over the gate insulating layer 204 (see FIG. 14A). After that, a first resist mask 231 is formed over the semiconductor layer 209 including an impurity element which serves as a donor (see FIG. 14B).

The semiconductor layer 205 can be formed in a manner similar to that of the semiconductor layer 105 in Embodiment 1. The semiconductor layer 209 including an impurity element which serves as a donor can be formed in a manner similar to that of the semiconductor layer 109 including an impurity element which serves as a donor in Embodiment 1.

Note that the semiconductor layer 205 may be formed by any of the methods described in Embodiments 2 to 4.

Figure 14C:
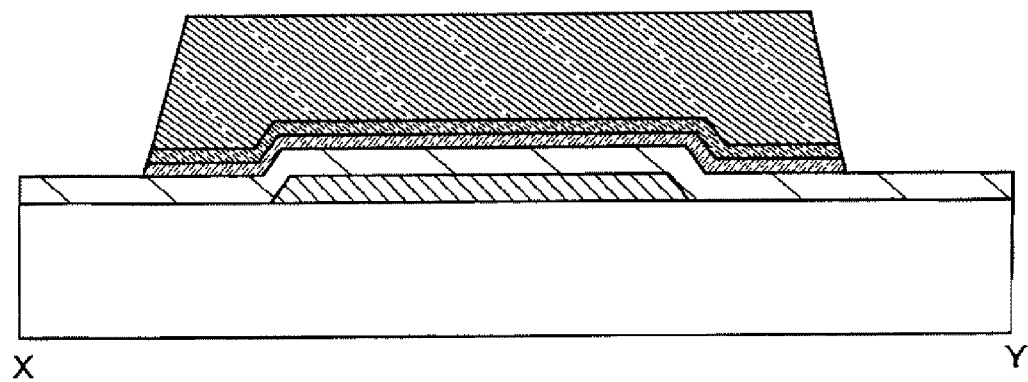
Figure 15A:
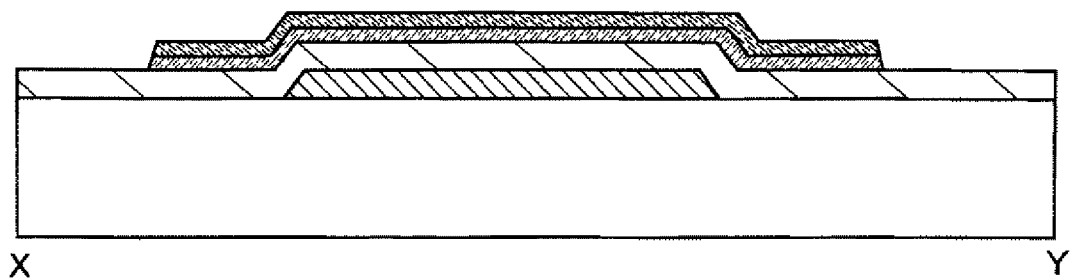
FIGS. 15A to 15C are views illustrating an example of a method for manufacturing a thin film transistor.

Next, the semiconductor layer 205 and the semiconductor layer 209 including an impurity element which serves as a donor are etched using the first resist mask 231 to form an island-like semiconductor layers (see FIG. 14C). After that, the first resist mask 231 is removed (see FIG. 15A).

Figure 15B:
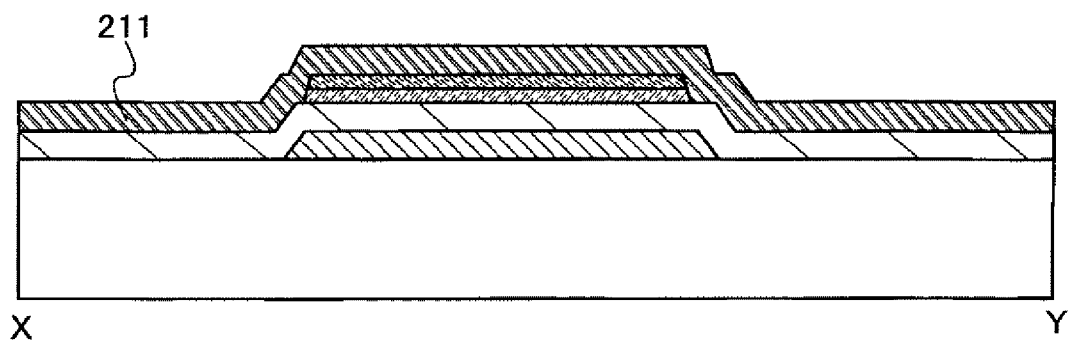
Figure 15C:
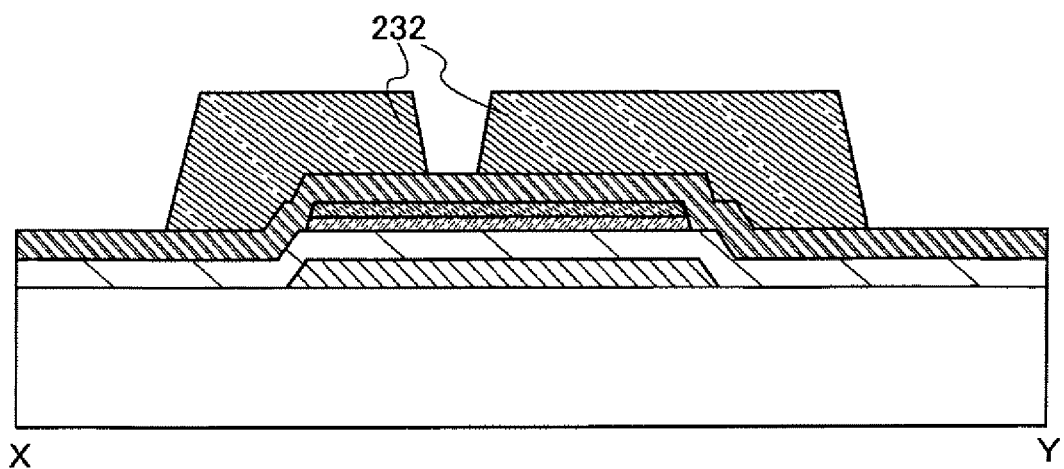

Next, a conductive layer 211 is formed so as to cover the etched semiconductor layer 205 and the semiconductor layer 209 including an impurity element which serves as a donor (see FIG. 15B). The conductive layer 211 can be formed using a material and by a method which are similar to those of the conductive layer 111. After that, a second resist mask 232 is formed over the conductive layer 211 (see FIG. 15C).

Figure 16A:
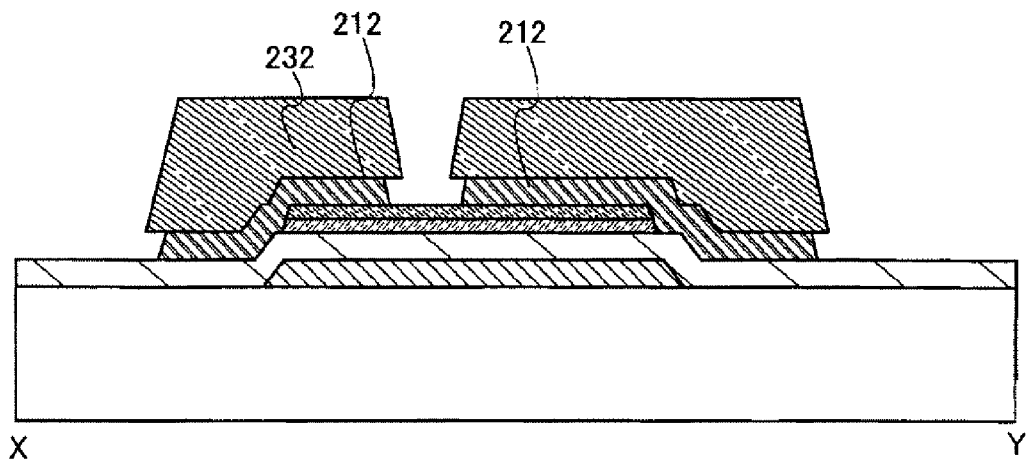
FIGS. 16A to 16C are views illustrating an example of a method for manufacturing a thin film transistor.

Next, the conductive layer 211 is etched using the second resist mask 232 to form a wiring layer 212 (see FIG. 16A). The wiring layer 212 forms source and drain electrodes. The etching of the conductive layer 211 is preferably performed by wet etching. By wet etching, the conductive layer is selectively etched. As a result, the side surface of the conductive layer 211 recedes to an inner side than the side surface of the second resist mask 232, and the wiring layer 212 is formed. Thus, the side surface of the wiring layer 212 is not coplanar to the side surface of the etched semiconductor layer 209 including an impurity element which serves as a donor, and the side surface of the source and drain regions are formed outside of the side surface of the wiring layer 212. The wiring layer 212 serves not only as source and drain electrodes but also as a signal line. However, without limitation thereto, a signal line may be provided separately from the wiring layer 212.

Figure 16B:
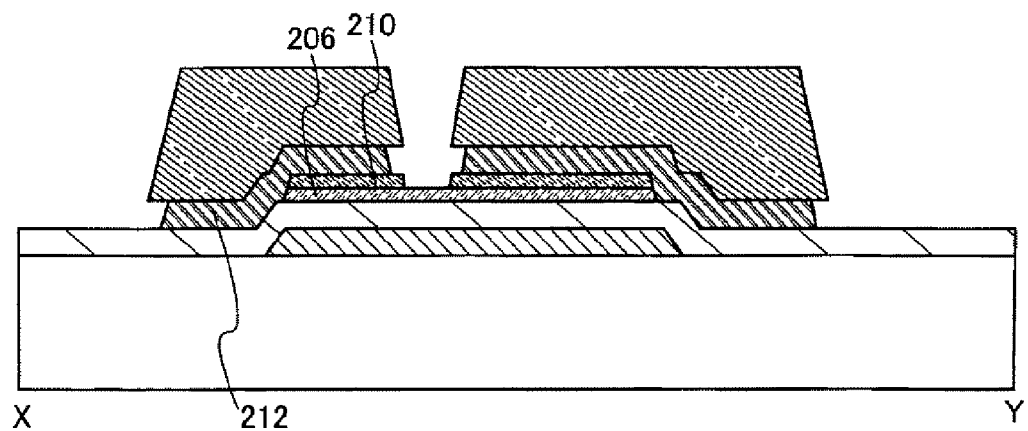

Next, the island-shaped semiconductor layer 209 including an impurity element which serves as a donor are etched using the second resist mask 232 (see FIG. 16B), by which the semiconductor layer 206 and the source and drain regions 210 are formed.

Figure 16C:
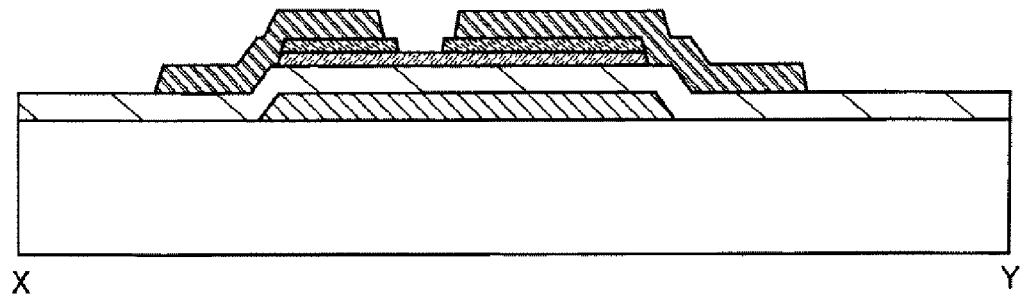

Then, in a manner similar to that of Embodiment 1, dry etching may be performed under such a condition that the semiconductor layer 206 is not damaged and the etching rate with respect to the semiconductor layer 206 is low, with the second resist mask 232 remained. Furthermore, the second resist mask 232 may be removed by water plasma treatment (FIG. 16C).

The thin film transistor according to this embodiment can be manufactured through the above steps. The thin film transistor according to this embodiment can be applied to a switching transistor provided for a pixel of a display device which is typified by a liquid crystal display device, in a manner similar to that of the thin film transistor described in Embodiment 1. Therefore, the insulating layer 214 is formed so as to cover this thin film transistor. An opening is formed in the insulating layer 214 so as to reach the source and drain electrodes which are formed of the wiring layer 212. This opening can be formed by a photolithography method. After that, the pixel electrode layer 216 is formed over the insulating layer 214 so as to be connected through the opening, leading to the formation of the switching transistor provided for a pixel of a display device as illustrated in FIG. 12.

Note that the insulating layer 214 can be formed in a manner similar to that of the insulating layer 114 in Embodiment 1. In addition, the pixel electrode layer 216 can be formed in a manner similar to that of the pixel electrode layer 116 in Embodiment 1.

Although not illustrated, an insulating layer formed using an organic resin film by a spin coating method or the like may be formed between the insulating layer 214 and the pixel electrode layer 216.

A thin film transistor having high on-state current can be obtained without a multi-tone mask as described above in this embodiment.

Embodiment 6

In this embodiment, a liquid crystal display device including the thin film transistor described in Embodiment 5 will be described below as one mode of a display device. Here, a vertical alignment (VA) liquid crystal display device will be described with reference to FIG. 17, FIG. 18, and FIG. 19. The VA liquid crystal display device is a kind of mode in which alignment of liquid crystal molecules of a liquid crystal panel is controlled. In the VA liquid crystal display device, liquid crystal molecules are arranged vertically to a panel surface when voltage is not applied. In this embodiment, it is devised to separate pixels into some regions (sub pixels) so that the liquid crystal molecules are aligned in different directions in the respective regions. This design is referred to as multi-domain or multi-domain design. In the following description, a liquid crystal display device with multi-domain design is described.

Figure 17:
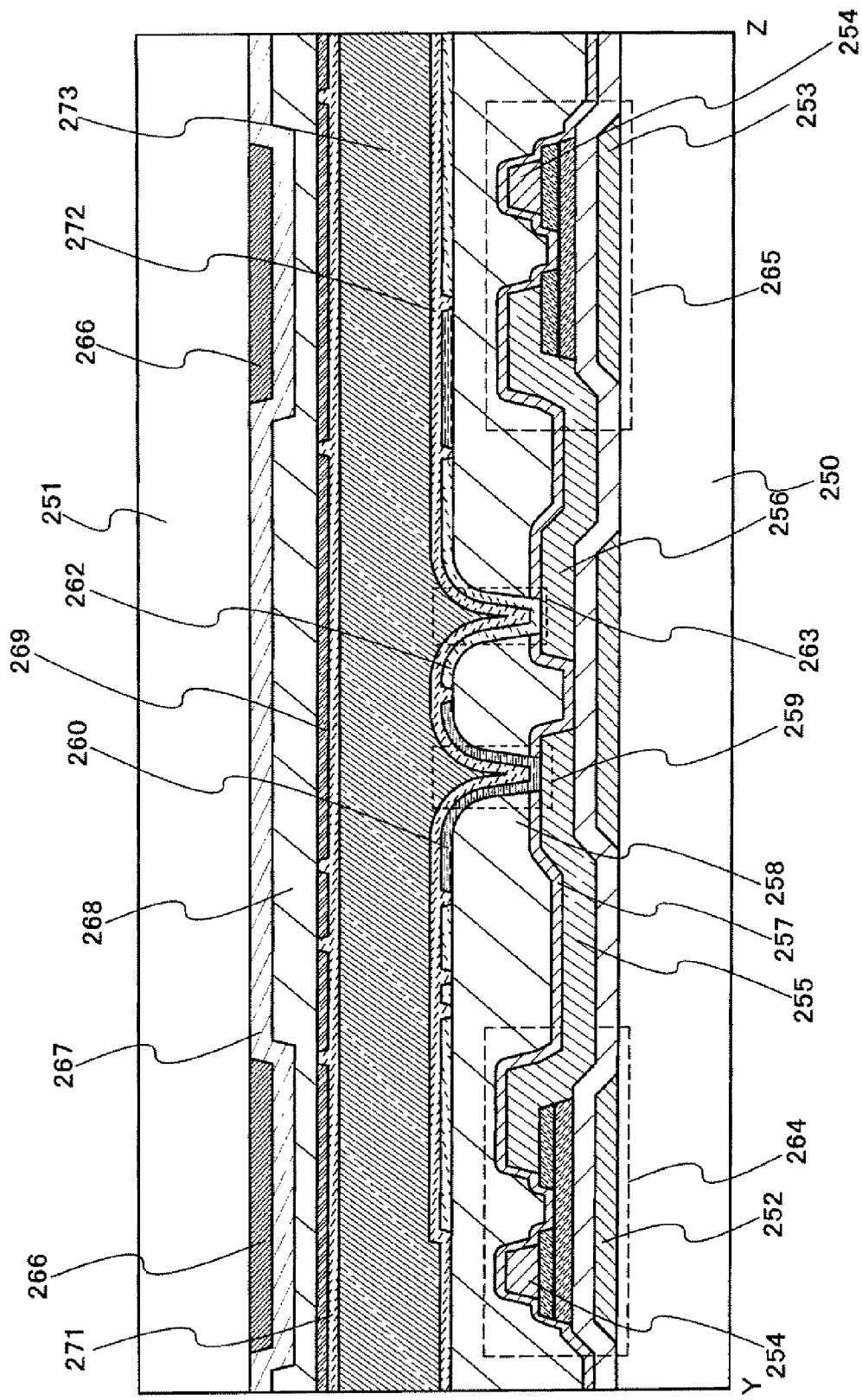
FIG. 17 is a view is a view illustrating an electronic device.
Figure 18:
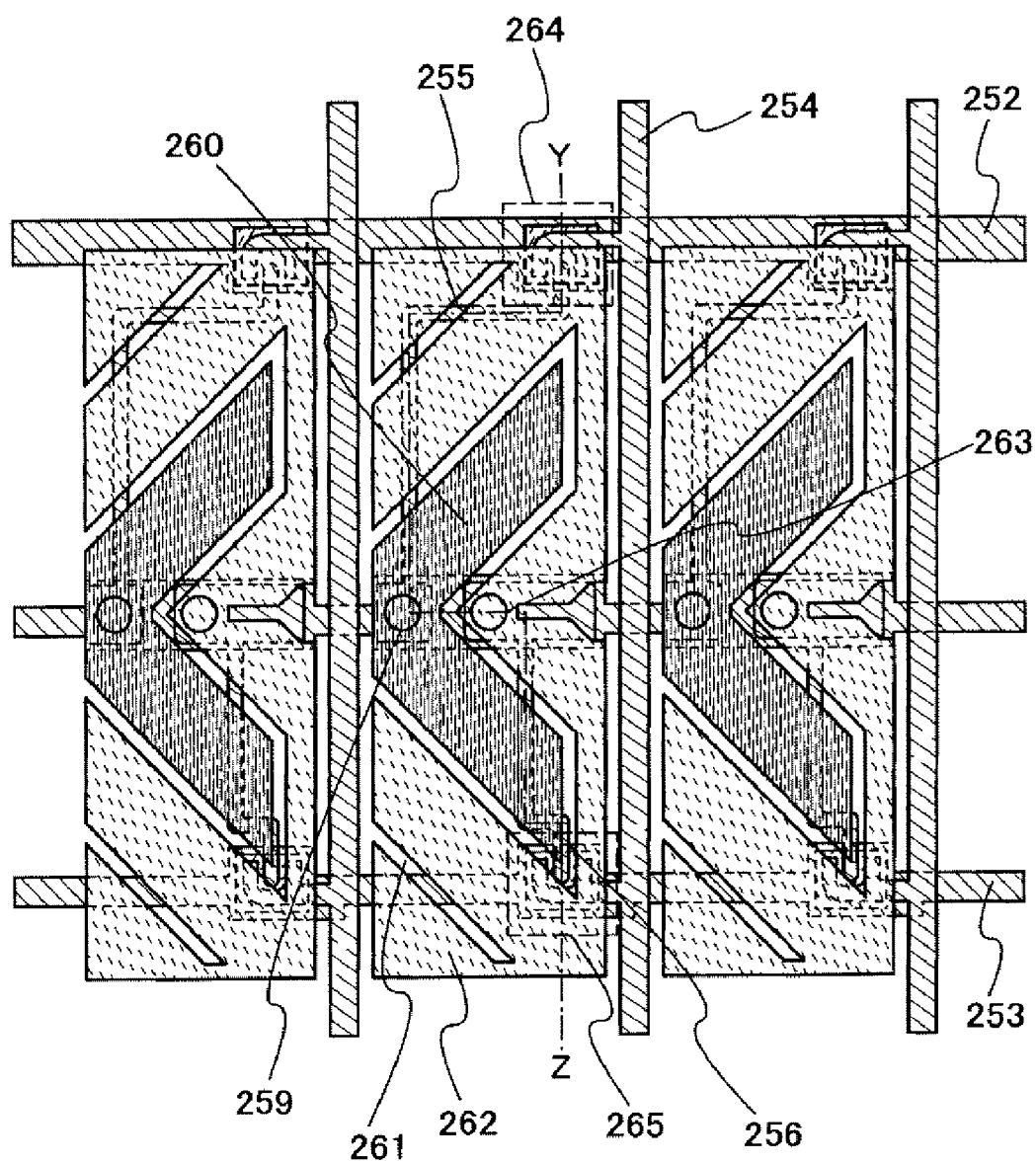
FIG. 18 is a view illustrating an electronic device.

FIG. 17 and FIG. 18 illustrate a pixel structure of the VA liquid crystal display device. FIG. 18 is a plan view of a pixel structure shown in this embodiment, and FIG. 17 illustrates a cross-sectional structure taken along line Y-Z in FIG. 18. Hereinafter, description is made with reference to FIG. 17 and FIG. 18.

In the pixel structure shown in this embodiment, one pixel provided over a substrate 250 includes a plurality of pixel electrodes, each of which is connected to a thin film transistor through a planarizing film 258 and an insulating layer 257. Each thin film transistor is driven by a different gate signal. Specifically, a pixel of multi-domain design has a structure in which a signal applied to each pixel electrode is independently controlled.

A pixel electrode 260 is connected to a thin film transistor 264 through a wiring 255 in an opening 259. In addition, a pixel electrode 262 is connected to a thin film transistor 265 through a wiring 256 in an opening 263. A gate electrode 252 of the thin film transistor 264 and a gate electrode 253 of the thin film transistor 265 are separated so that different gate signals can be given thereto. In contrast, a wiring 254 which serves as a data line is used in common for the thin film transistors 264 and 265. The thin film transistors 264 and 265 can be manufactured by the method described in Embodiment 5.

The pixel electrodes 260 and 262 have different shapes, and they are separated by a slit 261. The pixel electrode 262 is formed so as to surround the pixel electrode 260 which is extended into a V shape. Timing of voltage application to the pixel electrodes 260 and 262 is staggered by the thin film transistors 264 and 265 to control alignment of the liquid crystal. When different gate signals are supplied to the gate electrodes 252 and 253, operation timings of the thin film transistors 264 and 265 can be staggered. In addition, an alignment film 272 is formed over the pixel electrodes 260 and 262.

Figure 19:
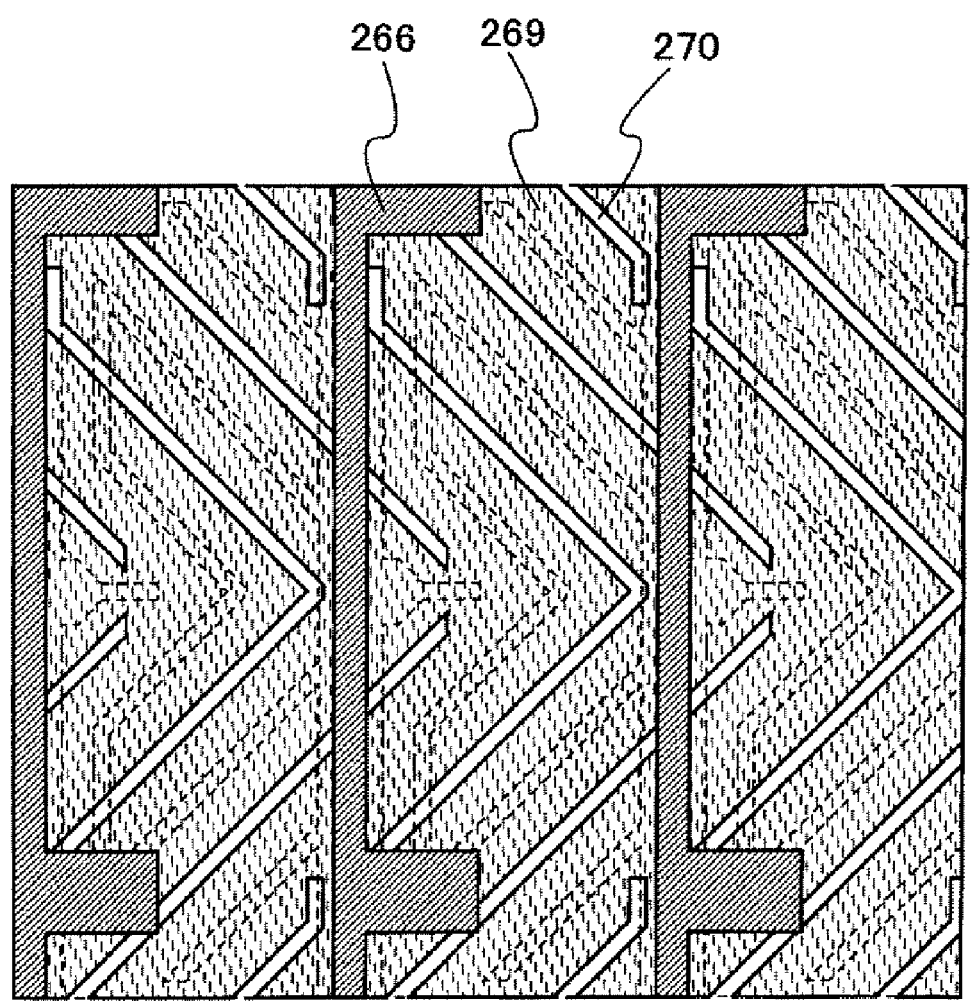
FIG. 19 is a view illustrating an electronic device.

A counter substrate 251 is provided with a light shielding film 266, a coloring film 267, and a counter electrode 269. In addition, a planarizing film 268 is formed between the coloring film 267 and the counter electrode 269 to prevent alignment disorder of liquid crystal. Moreover, an alignment film 271 is formed on the counter electrode 269. FIG. 19 illustrates a pixel structure of the counter substrate 251 side. The counter electrode 269 is used in common between different pixels and has a slit 270. When the slit 270 and the slit 261 of the pixel electrodes 260 and 262 are alternately provided, an oblique electric field is generated, so that alignment of liquid crystals can be controlled. Accordingly, an alignment direction of the liquid crystals can be varied depending on the place; therefore, the viewing angle can be widened.

Here, a substrate, a coloring film, a light shielding film, and a planarizing film form a color filter. Either or both the light shielding film and the planarizing film are not necessarily formed over the substrate.

The coloring film has a function of preferentially transmitting light of a predetermined wavelength range, among light of the wavelength range of visible light. In general, a coloring film which preferentially transmits light of a wavelength range of red light, a coloring film which preferentially transmits light of a wavelength range of blue light, and a coloring film which preferentially transmits light of a wavelength range of green light are often combined for the color filter. However, the combination of the coloring films is not limited to the above combination.

The region in which a liquid crystal layer 273 is interposed between the pixel electrode 260 and the counter electrode 269 corresponds to a first liquid crystal element. The region in which the liquid crystal layer 273 is interposed between the pixel electrode 262 and the counter electrode 269 corresponds to a second liquid crystal element. This is a multi-domain structure in which the first liquid crystal element and the second liquid crystal element are included in one pixel.

Note that although the VA liquid crystal display device is described here as a liquid crystal display device, the present invention is not limited thereto. In other words, the element substrate which is formed using the thin film transistor described in Embodiment 5 can be used for an FFS liquid crystal display device, an IPS liquid crystal display device, a TN liquid crystal display device, or another liquid crystal display device.

In addition, although the thin film transistor manufactured in Embodiment 5 is used in this embodiment the thin film transistor manufactured in Embodiment 1 may be used.

As described above, a liquid crystal display device can be manufactured. Since the thin film transistor having high on-state current is used as a pixel transistor in the liquid crystal display device of this embodiment, a liquid crystal display device having preferable image quality (for example, high contrast) and low power consumption can be manufactured.

Embodiment 7

In this embodiment, a light-emitting display device including the thin film transistor described in Embodiment 5 will be described as one mode of a display device. Here, a structural example of a pixel included in the light-emitting display device will be described. FIG. 20A illustrates a plan view of a pixel, and FIG. 20B illustrates a cross-sectional structure taken along line A-B in FIG. 20A.

In this embodiment, a light-emitting display device using a light-emitting element utilizing electroluminescence is described. Light-emitting elements utilizing electroluminescence are roughly classified according to whether a light-emitting material is an organic compound or an inorganic compound. In general, the former is referred to as organic EL elements and the latter as inorganic EL elements. Although Embodiment 5 is employed here for a manufacturing method of a thin film transistor, the manufacturing method is not limited and that described in Embodiment 1 may be employed.

In an organic EL element, by application of voltage to a light-emitting element, electrons and holes are separately injected from a pair of electrodes into a layer including a light-emitting organic compound, and current flows. Then, by recombination of these carriers (electrons and holes), the light-emitting organic compound forms an excited state, and light is emitted when the excited state relaxes to a ground state. Such a light-emitting element is called a current-excitation light-emitting element owing to the above-mentioned mechanism.

Inorganic EL elements are classified into a dispersion-type inorganic EL element and a thin-film-type inorganic EL element according to their element structures. A dispersion type inorganic EL element has a light-emitting layer where particles of a light-emitting material are dispersed in a binder, and its light emission mechanism is donor-acceptor recombination type light emission in which a donor level and an acceptor level are utilized. The thin-film type inorganic EL element has a structure in which a light-emitting layer is interposed between dielectric layers and the light-emitting layer interposed between the dielectric layers is further interposed between electrodes. The light emission mechanism is a local emission in which inner shell electron transition of a metal ion is utilized. Note that description is made here using an organic EL element as a light-emitting element.

In FIGS. 20A and 20B, a first thin film transistor 281a corresponds to a switching thin film transistor which controls input of a signal to a pixel electrode, and a second thin film transistor 281b corresponds to a driving thin film transistor which controls current or voltage to a light-emitting element 282.

In the first thin film transistor 281a, a gate electrode is connected to a scanning line 283a, one of source and drain regions is connected to a signal line 284a, and the other of the source and drain regions is connected to a gate electrode 283b of the second thin film transistor 281b through a wiring 284b. In the second thin film transistor 281b, one of source and drain regions is connected to a power supply line 285a, and the other of the source and drain regions is connected to a pixel electrode (a cathode 288) of a light-emitting element through a wiring 285b. The gate electrode and a gate insulating film of the second thin film transistor 281b and the power supply line 285a form a capacitor 280, and the other of source and drain electrodes of the first thin film transistor 281a is connected to the capacitor 280.

Note that when the first thin film transistor 281a is in an off state, the capacitor 280 corresponds to a capacitor for holding potential difference between the gate electrode and a source electrode of the second thin film transistor 281b or potential difference between the gate electrode and a drain electrode thereof (hereinafter referred to as gate voltage). However, the capacitor 280 is not necessarily provided.

In this embodiment, although the first thin film transistor 281a and the second thin film transistor 281b are formed of n-channel thin film transistors, either or both of them may be formed of p-channel thin film transistors.

An insulating layer 286 is formed over the first thin film transistor 281a and the second thin film transistor 281b, a planarizing film 287 is formed over the insulating layer 286, an opening is formed in the planarizing film 287 and the insulating layer 286, and the cathode 288 connecting to the wiring 285b through the opening is formed. The planarizing film 287 is preferably formed using an organic resin such as an acrylic resin, polyimide, or polyamide, or a siloxane polymer. In the opening, the cathode 288 has unevenness; therefore, a partition wall 291 which covers the uneven region of the cathode 288 and has an opening is provided. An EL layer 289 is formed so as to be in contact with the cathode 288 through the opening of the partition wall 291, an anode 290 is formed so as to cover the EL layer 289, and a protective insulating film 292 is formed so as to cover the anode 290 and the partition wall 291.

Here, the light-emitting element 282 with a top emission structure is shown as a light-emitting element. Since the light-emitting element 282 with a top emission structure can extract light emission in a region where the first thin film transistor 281a and the second thin film transistor 281b are overlapped with the EL layer 289, a broad light emission area can be obtained. However, when the first thin film transistor 281a and the second thin film transistor 281b provide unevenness of the cathode 288, the thickness distribution of the EL layer 289 is not uniform, which readily causes a short circuit between the anode 290 and the cathode 288, to result in display defects. Therefore, the planarizing film 287 is preferably provided, which can improve yield of the light-emitting display device.

The region where the EL layer 289 is interposed between the cathode 288 and the anode 290 corresponds to the light-emitting element 282. In the case of the pixel illustrated in FIGS. 20A and 20B, light emitted from the light-emitting element 282 is emitted on the anode 290 side as illustrated by a hollow arrow in FIG. 20B.

As the cathode 288, any known conductive film can be used as long as it has a low work function and reflects light. For example, Ca, MgAg, AlLi, or the like is preferably used. The EL layer 289 may be formed using either a single-layer structure or a stacked structure of a plurality of layers. In the case of using a structure where a plurality of layers are stacked, an electron injecting layer, an electron transporting layer, a light-emitting layer, a hole transporting layer, and a hole injecting layer are sequentially stacked over the cathode 288. The entry of the electron injection layer allows the use of a metal with a high work function such as Al as the cathode 288. Note that layers other than the light-emitting layer, for example, the electron injecting layer, the electron transporting layer, the hole transporting layer, and the hole injecting layer are not necessarily provided all, and a layer which is necessary may be provided as appropriate. The anode 290 is formed using a light-transmitting conductive material which transmits light, and, for example, a light-transmitting conductive film such as a film of indium oxide including tungsten oxide, indium zinc oxide including tungsten oxide, indium oxide including titanium oxide, indium tin oxide including titanium oxide, ITO, indium zinc oxide, or indium tin oxide to which silicon oxide is added may be used.

Although the light-emitting element with a top emission structure in which light emission is extracted from a side opposite to a substrate is described here, the present invention is not limited thereto. In other words, a light-emitting element with a bottom emission structure in which light emission is extracted from a substrate side or a light-emitting element with a dual emission structure in which light emission is extracted from both a substrate side and a side opposite to a substrate may be employed.

Although an organic EL element is described here as a light-emitting element, an inorganic EL element may be used as a light-emitting element.

Note that although an example in which a thin film transistor for controlling the driving of a light-emitting element (a driving thin film transistor) is connected to a light-emitting element is shown in this embodiment, a thin film transistor for controlling current may be connected between the driving thin film transistor and the light-emitting element.

As described above, a light-emitting display device can be manufactured. Since the thin film transistor having high on-state current is used as a pixel transistor in the light-emitting display device of this embodiment, a light-emitting display device having preferable image quality (for example, high contrast) and low power consumption can be manufactured.

Embodiment 8

Next, a structural example of a display panel included in a display device will be described.

Figure 21A:
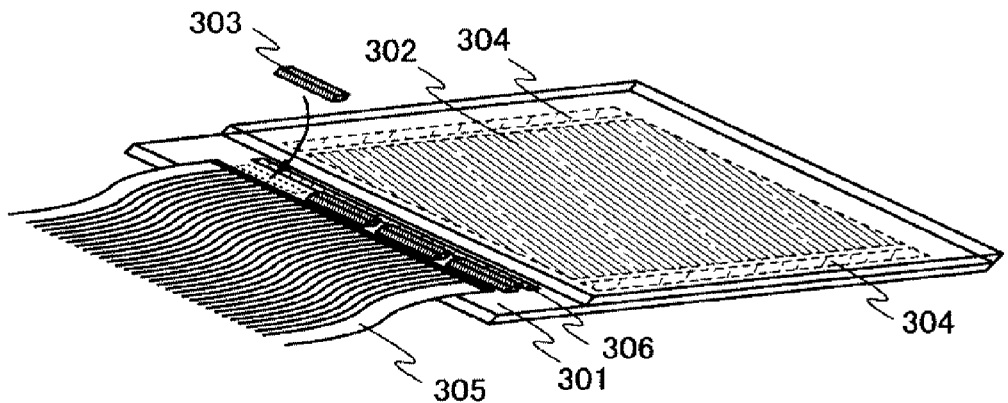
FIGS. 21A to 21C are views each illustrating an electronic device.

FIG. 21A illustrates a mode of a display panel in which a signal line driver circuit 303 is formed separately and connected to a pixel portion 302 formed over a substrate 301. An element substrate provided with the pixel portion 302, a protective circuit 306, and a scanning line driver circuit 304 is formed using the thin film transistor described in Embodiment 1 or the like. The signal line driver circuit 303 may be formed with a transistor using a single crystal semiconductor, a transistor using a polycrystalline semiconductor, or a transistor using silicon formed on an insulator (SOI). The transistor using SOI includes a transistor in which a single crystal semiconductor layer is provided over a glass substrate. To each of the pixel portion 302, the signal line driver circuit 303, and the scanning line driver circuit 304, potential of power supply, various signals, and the like are supplied through an FPC 305. The protective circuit 306 formed with the thin film transistor described in Embodiment 1 or the like may be provided either between the signal line driver circuit 303 and the FPC 305 or between the signal line driver circuit 303 and the pixel portion 302, or both. The protective circuit 306 may be provided with one or more elements selected from a thin film transistor with another structure, a diode, a resistive element, a capacitor, or the like.

Note that the signal line driver circuit 303 and the scanning line driver circuit 304 may both be formed over a single substrate over which a pixel transistor of the pixel portion is formed.

Figure 21B:
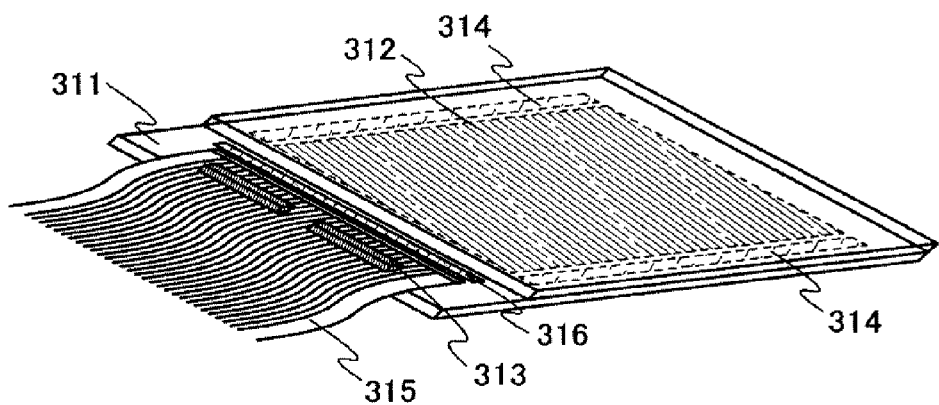

When the driver circuit is separately formed, a substrate provided with the driver circuit is not always necessary to be attached to a substrate provided with the pixel portion, and may be attached to, for example, the FPC. FIG. 21B illustrates a mode of a display panel in which an element substrate provided with a pixel portion 312, a protective circuit 316, and a scanning line driver circuit 314 which are formed over a substrate 311 is connected to an FPC 315, with only a signal line driver circuit 313 formed separately. The pixel portion 312, the protective circuit 316, and the scanning line driver circuit 314 are formed using the thin film transistor described in the above Embodiment 1. The signal line driver circuit 313 is connected to the pixel portion 312 through the FPC 315 and the protection circuit 316. To each of the pixel portion 312, the signal line driver circuit 313, and the scanning line driver circuit 314, potential of power supply, various signals, and the like are inputted through the FPC 315.

Figure 21C:
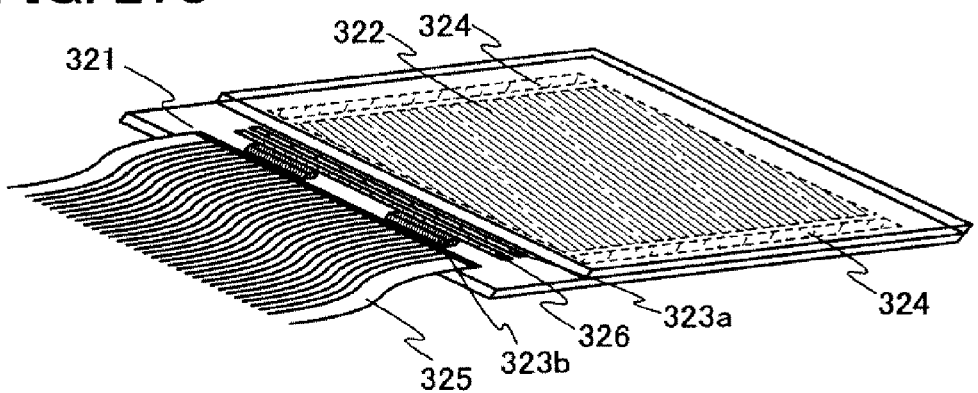

Furthermore, only part of the signal line driver circuit or part of the scanning line driver circuit may be formed over one substrate where the pixel portion is formed, using any of the thin film transistors described in the above embodiments, and the rest may be formed separately and electrically connected to the pixel portion. FIG. 21C illustrates the mode of a display panel in which an analog switch 323a included in a signal line driver circuit is formed over one substrate 321, over which a pixel portion 322 and a scanning line driver circuit 324 are formed, and a shift register 323b included in the signal line driver circuit is separately formed over a different substrate and then attached to the substrate 321. The pixel portion 322, a protective circuit 326, and the scanning line driver circuit 324 are each formed using any of the thin film transistors described in the above embodiments. The shift register 323b included in the signal line driver circuit is connected to the pixel portion 322 through an FPC 325 and the protective circuit 326. To each of the pixel portion 322, the signal line driver circuit, and the scanning line driver circuit 324, potential of power supply, various signals, and the like are inputted through the FPC 325. The protective circuit 326 may be provided between the shift register 323b and the analog switch 323a.

As illustrated in each of FIGS. 21A to 21C, in the display device of this embodiment, entire driver circuits or part thereof can be formed over a single substrate over which the pixel portion is formed. Thin film transistors which are provided for the signal line driver circuit and the scanning line driver circuit can be formed as described in any of the above embodiments. Note that the structure of the display device is not limited to the above. The protective circuit is not necessarily provided, if not necessary.

Note that a connection method of a circuit which is separately formed is not particularly limited, and a known method such as COG method, wire bonding method, TAB method, or the like can be used. In addition, a position for connection is not limited to the position illustrated in FIGS. 21A to 21C as long as electrical connection is possible. A controller, a CPU, a memory, or the like may be formed separately and connected.

Note that the signal line driver circuit includes a shift register and an analog switch. In addition to the shift register and the analog switch, another circuit such as a buffer, a level shifter, or a source follower may be included. The shift register and the analog switch are not necessarily provided, and for example, a different circuit such as a decoder circuit which can select signal lines may be used instead of the shift register, and a latch or the like may be used instead of the analog switch.

Embodiment 9

An element substrate which is formed of the thin film transistor described in any of the above embodiments and a display device or the like with the use of this element substrate can be applied to an active-matrix display device panel. Further, the element substrate and the display device or the like can be applied to an electronic device by being incorporated into a display portion.

Examples of such electronic devices include a camera such as a video camera or a digital camera, a head-mounted display (a goggle-type display), a car navigation system, a projector, a car stereo, a personal computer, and a portable information terminal (such as a mobile computer, a cellular phone, or an e-book reader). Examples of these devices are illustrated in FIGS. 22A to 22D.

FIG. 22A illustrates a television device. The television device can be completed by incorporating the display panel to which the above embodiment is applied into a housing. A main screen 333 is formed with the display panel, and a speaker portion 339, operation switches, or the like are provided as other additional accessories.

As illustrated in FIG. 22A, a display panel 332 utilizing a display element is incorporated into a housing 331. In addition to reception of general television broadcast by a receiver 335, communication of information in one direction (from a transmitter to a receiver) or in two directions (between a transmitter and a receiver or between receivers) can be performed by connection to a wired or wireless communication network through a modem 334. Operation of the television device can be performed by the switch incorporated into the housing or a remote control device 336. This remote control device may also be provided with a display portion 337 for displaying output information, and the display portion 337 may also be provided with the thin film transistor of Embodiment 1 or the like. Further, the television device may include a sub screen 338 formed with a second display panel to display channels, volume, or the like, in addition to the main screen 333. In this structure, the thin film transistor of Embodiment 1 or the like can be applied to either or both the main screen 333 and the sub screen 338.

Figure 23:
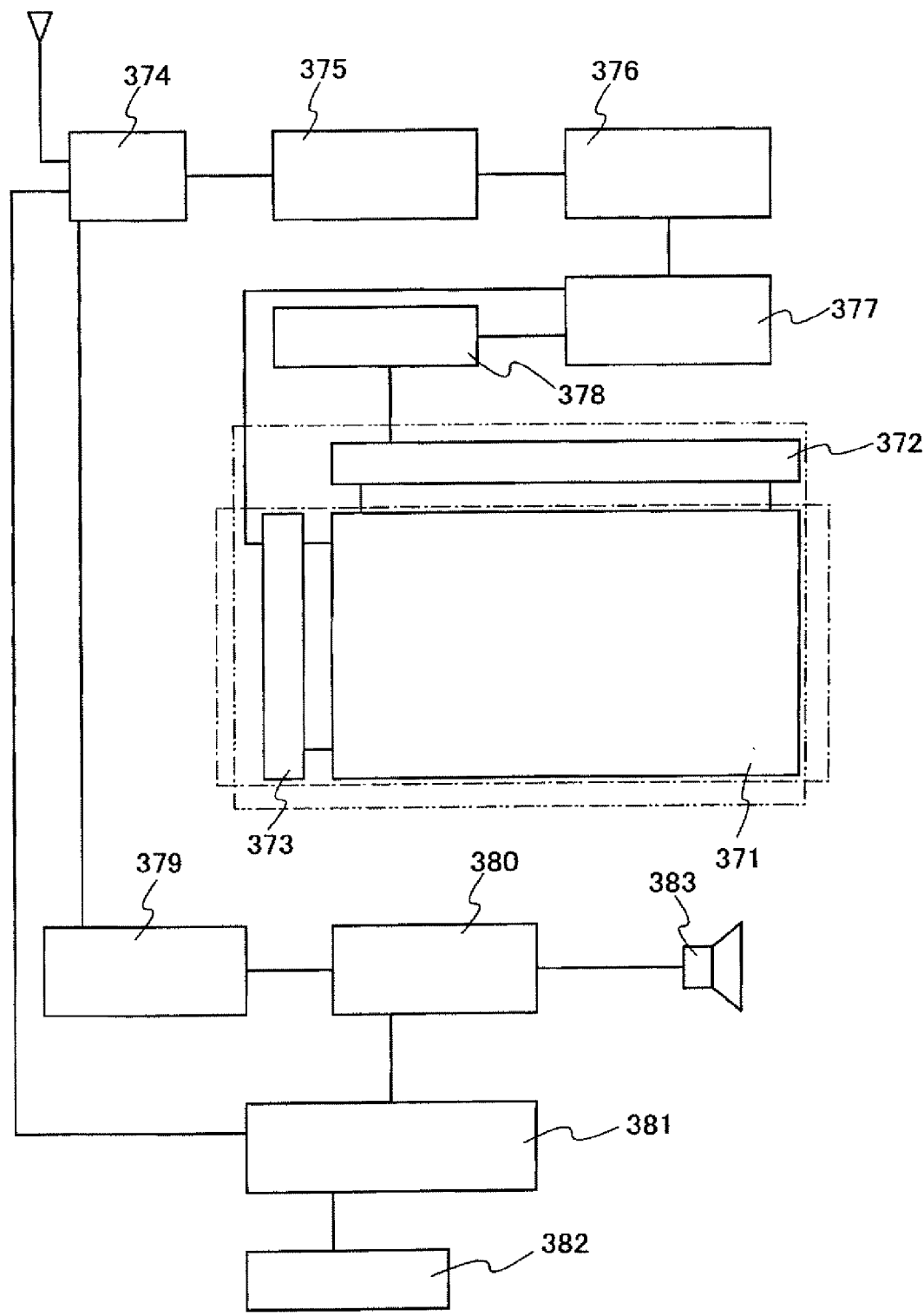
FIG. 23 is a block diagram of an electronic device.

FIG. 23 is a block diagram illustrating a main structure of a television device. A display panel is provided with a pixel portion 371. A signal line driver circuit 372 and a scanning line driver circuit 373 may be mounted on the display panel by a COG method.

As another external circuit, a video signal amplifier circuit 375 that amplifies a video signal among signals received by a tuner 374; a video signal processing circuit 376 that converts the signals outputted from the video signal amplifier circuit 375 into chrominance signals corresponding to respective colors of red, green, and blue; a control circuit 377 that converts the video signal into an input specification of the driver IC; and the like are provided on an input side of the video signal. The control circuit 377 outputs a signal to both a scanning line side and a signal line side. In the case of digital driving, a structure may be employed in which a signal line dividing circuit 378 is provided on the signal line side and an input digital signal is divided into m pieces to be inputted.

Among the signals received by the tuner 374, an audio signal is transmitted to an audio signal amplifier circuit 379, and an output thereof is inputted into a speaker 383 through an audio signal processing circuit 380. A control circuit 381 receives control information of a receiving station (received frequency) or a sound volume from an input portion 382, and transmits signals to the tuner 374 and the audio signal processing circuit 380.

Note that the present invention is not limited to a television device and can be applied to monitors of personal computers, or display media having a large area, such as information display boards in railway stations, airports, and the like, and street-side advertisement display boards.

As described above, a television device having high image quality and low power consumption can be manufactured by applying the thin film transistor described in Embodiment 1 or the like to either or both the main screen 333 and the sub screen 338.

FIG. 22B illustrates one example of a cellular phone 341. The cellular phone 341 includes a display portion 342, an operation portion 343, and the like. The image quality thereof can be improved and the power consumption thereof can be reduced by applying, to the display portion 342, the thin film transistor described in Embodiment 1 or the like.

A portable computer illustrated in FIG. 22C includes a main body 351, a display portion 352, and the like. The image quality thereof can be improved and the power consumption thereof can be reduced by applying, to the display portion 352, the thin film transistor described in Embodiment 1 or the like.

FIG. 22D illustrates a desk lamp, which includes a lighting portion 361, a shade 362, an adjustable arm 363, a support 364, a base 365, a power source 366, and the like. The desk lamp is formed using, for the lighting portion 361, the light-emitting device which is described in the above embodiment. The power consumption thereof can be reduced by applying, to the lighting portion 361, the thin film transistor described in Embodiment 1 or the like.

Figure 24A:
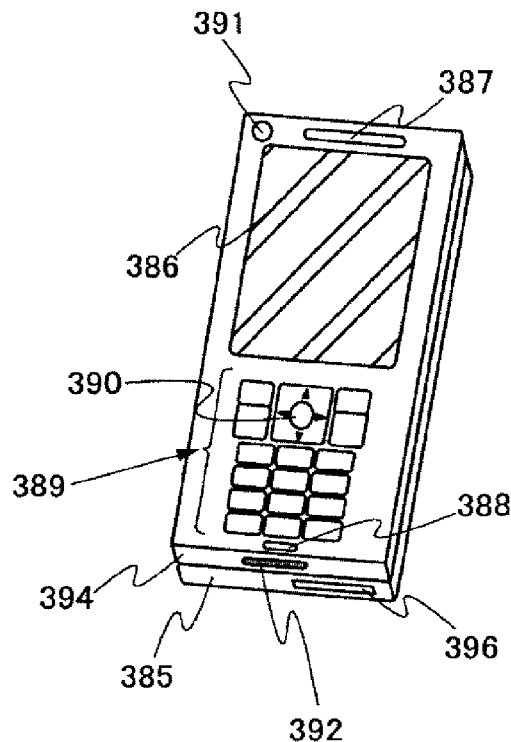
FIGS. 24A to 24C are views illustrating an electronic device.
Figure 24B:
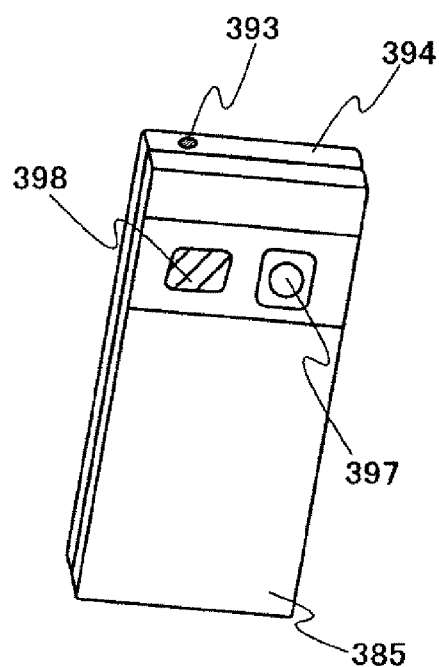
Figure 24C:
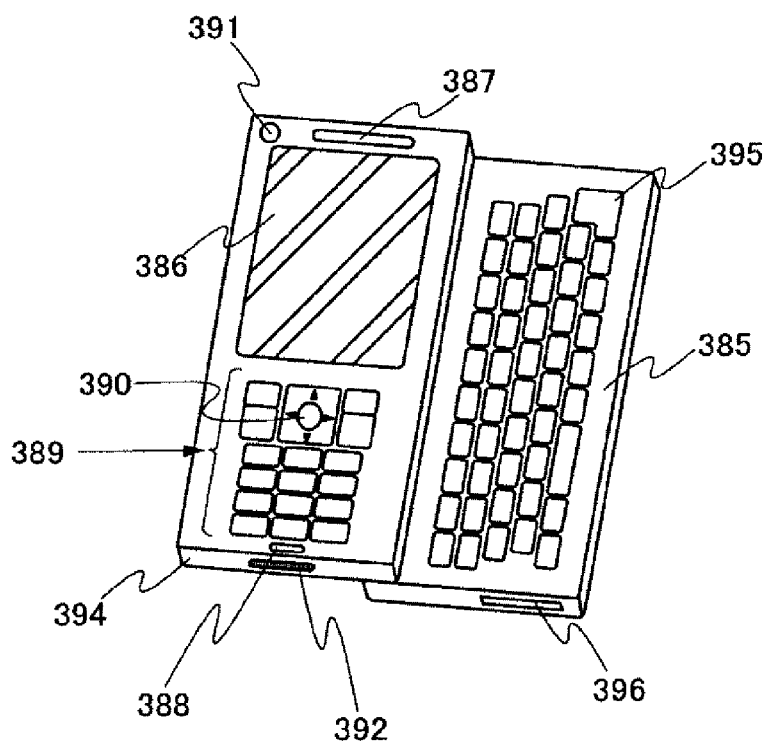

FIGS. 24A to 24C illustrate a structural example of a cellular phone, and the element substrate having the thin film transistor described in Embodiment 1 or the like and the display device having the element substrate are applied to, for example, a display portion thereof. FIG. 24A is a front view, FIG. 24B is a rear view, and FIG. 24C is a development view. The cellular phone illustrated in FIG. 24A to 24B includes two housings, a housing 394 and a housing 385. The cellular phone illustrated in FIGS. 24A to 24C, which is also referred to as a smartphone, has both of functions of a cellular phone and a portable information terminal, incorporates a computer, and can perform a variety of data processing in addition to voice calls.

The housing 394 includes a display portion 386, a speaker 387, a microphone 388, operation keys 389, a pointing device 390, a front camera lens 391, a jack 392 for an external connection terminal, an earphone terminal 393, and the like, while the housing 385 includes a keyboard 395, an external memory slot 396, a rear camera 397, a light 398, and the like. In addition, an antenna is incorporated into the housing 394.

In addition to the structure described above, a non-contact IC chip, a small size memory device, or the like can be incorporated therein.

The housings 394 and 385 are overlapped with each other in FIG. 24A, and slid, and the cellular phone is developed as illustrated in FIG. 24C. In the display portion 386, the display device described in Embodiment 1 or the like can be incorporated, and display direction can be changed as appropriate depending on a use mode. Note that since the front camera lens 391 is provided in the same plane as the display portion 386, the cellular phone can be used as a videophone. A still image and a moving image can be taken by the rear camera 397 and the light 398 by using the display portion 386 as a viewfinder.

The speaker 387 and the microphone 388 can be used for videophone, recording and playing sound, and the like without being limited to voice calls. With the use of the operation keys 389, operation of incoming and outgoing calls, simple information input such as electronic mail, scrolling of a screen, cursor motion, and the like are possible.

If much information needs to be treated, such as documentation, use as a portable information terminal, and the like, it is convenient to use the keyboard 395. The housings 394 and 385 that are overlapped with each other (FIG. 24A) can be slid and the cellular phone can be developed as illustrated in FIG. 24C, so that the cellular phone can be used as an information terminal. In addition, with the use of the keyboard 395 and the pointing device 390, a cursor can be moved smoothly. An AC adaptor and various types of cables such as a USB cable can be connected to the jack 392 for an external connection terminal, through which charging and data communication with a personal computer or the like are possible. Moreover, by inserting a recording medium into the external memory slot 396, a large amount of data can be stored and moved.

In the rear surface of the housing 385 (FIG. 24B), the rear camera 397 and the light 398 are provided, and a still image and a moving image can be taken by using the display portion 386 as a viewfinder.

Further, the cellular phone may have an infrared communication function, a USB port, a function of receiving one segment television broadcast, a non-contact IC chip, an earphone jack, or the like, in addition to the above structures.

The image quality thereof can be improved and the power consumption thereof can be reduced by applying, to a pixel, the thin film transistor described in Embodiment 1 or the like.

This application is based on Japanese Patent Application serial no. 2008-109657 filed with Japan Patent Office on Apr. 18, 2008, the entire contents of which are hereby incorporated by reference.

EXPLANATION OF REFERENCE

100: substrate, 102: gate electrode layer, 104: gate insulating layer, 105: semiconductor layer, 106: semiconductor layer, 109: semiconductor layer including an impurity element which serves as a donor, 110: source and drain regions, 111: conductive layer, 112: wiring layer, 114: insulating layer, 116: pixel electrode layer, 120: first region, 121: crystal particle, 122: second region, 131: first resist mask, 132: second resist mask, 141: treatment chamber, 142: stage, 143: gas supply portion, 144: shower plate, 145: exhaust port, 146: upper electrode, 147: lower electrode, 148: alternate-current power source, 149: temperature control portion, 150: gas supply means, 151: exhaust means, 152: cylinder, 153: pressure adjusting valve, 154: stop valve, 155: mass flow controller, 156: butterfly valve, 157: conductance valve, 158: turbo-molecular pump, 159: dry pump, 160: cryopump, 161: plasma CVD apparatus, 180: gray-tone mask, 181: substrate, 182: light-shielding portion, 183: diffraction grating portion, 185: half-tone mask, 186: substrate, 187: semi-light-transmitting portion, 188: light-shielding portion, 200: substrate, 202: gate electrode layer, 204: gate insulating layer, 205: semiconductor layer, 206: semiconductor layer, 209: semiconductor layer including an impurity element which serves as a donor, 210: source and drain regions, 211: conductive layer, 212: wiring layer, 214: insulating layer, 216: pixel electrode layer, 231: first resist mask, 232: second resist mask, 250: substrate, 251: counter substrate, 252: gate electrode, 253: gate electrode, 254: wiring, 255: wiring, 256: wiring, 257: insulating layer, 258: planarizing film, 259: opening, 260: pixel electrode, 261: slit, 262: pixel electrode, 263: opening; 264: thin film transistor, 265: thin film transistor, 266: light-shielding film, 267: coloring film, 268: planarizing film, 269: counter electrode, 270: slit, 271: alignment film, 272: alignment film, 273: liquid crystal layer, 280: capacitor, 281a: thin film transistor, 281b: thin film transistor, 282: light-emitting element, 283a: scanning line, 283b: gate electrode, 284a: signal line, 284b: wiring, 285a: power supply line, 285b: wiring, 286: insulating layer, 287: planarizing film, 288: cathode, 289: EL layer, 290: anode, 291: partition wall, 292: protective insulating film, 301: substrate, 302: pixel portion, 303: signal line driver circuit, 304: scanning line driver circuit, 305: FPC, 306: protective circuit, 311: substrate, 312: pixel portion, 313: signal line driver circuit, 314: scanning line driver circuit, 315: FPC, 316: protective circuit, 321: substrate, 322: pixel portion, 323a: analog switch, 323b: shift register, 324: scanning line driver circuit, 325: FPC, 326: protective circuit, 331: housing, 332: display panel, 333: main screen, 334: modem, 335: receiver, 336: remote control device, 337: display portion, 338: sub screen, 339: speaker portion, 341: cellular phone, 342: display portion, 343: operation portion, 351: main body, 352: display portion, 361: lighting portion, 362: shade, 363: adjustable arm, 364: support, 365: base, 366: power source, 371: pixel portion, 372: signal line driver circuit, 373: scanning line driver circuit, 374: tuner, 375: video signal amplifier circuit, 376: video signal processing circuit, 377: control circuit, 378: signal dividing circuit, 379: audio signal amplifier circuit, 380: audio signal processing circuit, 381: control circuit, 382: input portion, 383: speaker, 385: housing, 386: display portion, 387: speaker, 388: microphone, 389: operation keys, 390: pointing device, 391: front camera lens, 392: a jack for an external connection terminal, 393: earphone terminal, 394: housing, 395: keyboard, 396: external memory slot, 397: rear camera, and 398: light.

The invention claimed is:

1. A method for manufacturing a thin film transistor, the method comprising the steps of:
    forming a gate electrode over a substrate having an insulating surface;
    forming a gate insulating layer over the gate electrode, the gate insulating layer comprising silicon nitride;
    exposing the gate insulating layer to plasma generated by a gas containing nitrogen;
    forming a semiconductor layer over the gate insulating layer by using a mixed gas comprising a semiconductor material gas and a nitrogen-containing gas, wherein a concentration of the nitrogen-containing gas is reduced during the formation of the semiconductor layer;
    forming source and drain regions over the semiconductor layer wherein the source and drain regions comprise a semiconductor and an impurity imparting one conductivity type to the semiconductor; and
    forming source and drain electrodes over the source and drain regions, respectively.

2. The method according to claim 1,
wherein the gas containing nitrogen is an ammonia gas.

3. The method according to claim 1,
wherein the gas containing nitrogen is a mixed gas containing an ammonia gas and a hydrogen gas.

4. The method according to claim 1,
wherein the mixed gas further comprises a diluent gas.

5. The method according to claim 1,
wherein the mixed gas further comprises a diluent gas, and
wherein the semiconductor material gas is selected from a silicon hydride gas, a silicon fluoride gas, and a silicon chloride gas.

6. The method according to claim 1,
wherein the mixed gas further comprises a diluent gas, and
wherein the diluent gas is selected from a hydrogen gas, a nitrogen gas, and an ammonia gas.

7. The method according to claim 1,
wherein the gate insulating layer has a stacked structure in which a silicon oxynitride layer is stacked over a silicon nitride layer.

8. The method according to claim 1, further comprising a step of forming a second gate insulating layer over and in contact with the gate insulating layer,
    wherein the second gate insulating layer comprises silicon oxynitride, and
    wherein the exposure of the gate insulating layer to plasma is performed after forming the second gate insulating layer.

9. The method according to claim 1, further comprising a step of forming a second gate insulating layer over and in contact with the gate insulating layer,
    wherein the second gate insulating layer comprises silicon oxynitride and has a thickness greater than or equal to 1 nm and less than or equal to 3 nm.

10. A method for manufacturing a thin film transistor, the method comprising the steps of:
    forming a gate electrode over a substrate having an insulating surface;
    forming a gate insulating layer over the gate electrode in a treatment chamber, the gate insulating layer comprising silicon nitride;
    exposing the gate insulating layer to plasma generated by a gas containing nitrogen;
    removing the substrate from the treatment chamber;
    coating an inner wall of the treatment chamber with silicon nitride;
    providing the substrate into the treatment chamber;
    forming a semiconductor layer over the gate insulating layer in the treatment chamber by using a mixed gas comprising a semiconductor material gas and a nitrogen-containing gas, wherein a concentration of the nitrogen-containing gas is reduced during the formation of the semiconductor layer;
    forming source and drain regions over the semiconductor layer wherein the source and drain regions comprise a semiconductor and an impurity imparting one conductivity type to the semiconductor; and
    forming source and drain electrodes over the source and drain regions, respectively.

11. The method according to claim 10 further comprising a step of cleaning the treatment chamber,
wherein the cleaning of the treatment chamber is performed after removing the substrate from the treatment chamber and before providing the substrate into the treatment chamber.

12. The method according to claim 10 further comprising a step of exposing the gate insulating layer to an ammonia gas.

13. The method according to claim 10 further comprising a step of exposing the gate insulating layer to a mixed gas containing an ammonia gas and a hydrogen gas.

14. The method according to claim 10,
wherein the mixed gas further comprises a diluent gas.

15. The method according to claim 10,
wherein the mixed gas further comprises a diluent gas, and
wherein the semiconductor material gas is selected from a silicon hydride gas, a silicon fluoride gas, and a silicon chloride gas.

16. The method according to claim 10,
wherein the mixed gas further comprises a diluent gas, and
wherein the diluent gas is selected from a hydrogen gas, a nitrogen gas, and an ammonia gas.

17. The method according to claim 10,
wherein the gate insulating layer has a stacked structure in which a silicon oxynitride layer is stacked over a silicon nitride layer.

18. The method according to claim 10, further comprising a step of forming a second gate insulating layer over and in contact with the gate insulating layer,
wherein the second gate insulating layer comprises silicon oxynitride, and
wherein the exposure of the gate insulating layer to plasma is performed after forming the second gate insulating layer.

19. The method according to claim 10, further comprising a step of forming a second gate insulating layer over and in contact with the gate insulating layer,
wherein the second gate insulating layer comprises silicon oxynitride and has a thickness greater than or equal to 1 nm and less than or equal to 3 nm.

20. A method for manufacturing a thin film transistor, the method comprising the steps of:
forming a gate electrode over a substrate having an insulating surface;
forming a gate insulating layer over the gate electrode, the gate insulating layer comprising silicon nitride;
forming a semiconductor layer over the gate insulating layer by using a mixed gas comprising a semiconductor material gas and a nitrogen-containing gas, wherein a concentration of the nitrogen-containing gas is reduced as the formation of the semiconductor layer proceeds;
forming source and drain regions over the semiconductor layer wherein the source and drain regions comprise a semiconductor and an impurity imparting one conductivity type to the semiconductor; and
forming source and drain electrodes over the source and drain regions, respectively.

21. The method according to claim 20,
wherein the nitrogen-containing gas is selected from a nitrogen gas and an ammonia gas.

22. The method according to claim 20,
wherein the mixed gas further comprises a diluent gas.

23. The method according to claim 20,
wherein the mixed gas further comprises a hydrogen gas.

24. The method according to claim 20,
wherein the semiconductor material gas is selected from a silicon hydride gas, a silicon fluoride gas, and a silicon chloride gas.

25. The method according to claim 20,
wherein the gate insulating layer has a stacked structure in which a silicon oxynitride layer is stacked over a silicon nitride layer.

26. The method according to claim 20, further comprising a step of forming a second gate insulating layer over and in contact with the gate insulating layer,
wherein the second gate insulating layer comprises silicon oxynitride, and
wherein the exposure of the gate insulating layer to plasma is performed after forming the second gate insulating layer.

27. The method according to claim 20, further comprising a step of forming a second gate insulating layer over and in contact with the gate insulating layer,
wherein the second gate insulating layer comprises silicon oxynitride and has a thickness greater than or equal to 1 nm and less than or equal to 3 nm.

* * * * *